(12) United States Patent
Hiraga

(10) Patent No.: US 11,038,494 B2
(45) Date of Patent: Jun. 15, 2021

(54) SEMICONDUCTOR CIRCUIT AND METHOD OF CONTROLLING SAME

(71) Applicant: SONY SEMICONDUCTOR SOLUTIONS CORPORATION, Kanagawa (JP)

(72) Inventor: Keizo Hiraga, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/753,137

(22) PCT Filed: Sep. 25, 2018

(86) PCT No.: PCT/JP2018/035382
§ 371 (c)(1),
(2) Date: Apr. 2, 2020

(87) PCT Pub. No.: WO2019/073788
PCT Pub. Date: Apr. 18, 2019

(65) Prior Publication Data
US 2020/0252058 A1    Aug. 6, 2020

(30) Foreign Application Priority Data
Oct. 11, 2017 (JP) .............................. JP2017-197486

(51) Int. Cl.
*H03K 3/356* (2006.01)
*H03K 3/037* (2006.01)

(52) U.S. Cl.
CPC .......... *H03K 3/356* (2013.01); *H03K 3/0372* (2013.01)

(58) Field of Classification Search
CPC ..... H03K 3/356; H03K 3/0372; H03K 3/0375
(Continued)

(56) References Cited

U.S. PATENT DOCUMENTS

| | | | |
|---|---|---|---|
| 5,870,332 A * | 2/1999 | Lahey | G11C 5/005 365/156 |
| 9,559,671 B1 * | 1/2017 | Jagannathan | H03K 17/6872 |

(Continued)

FOREIGN PATENT DOCUMENTS

| | | |
|---|---|---|
| JP | 2011-123987 A | 6/2011 |
| JP | 2013-009308 A | 1/2013 |

(Continued)

OTHER PUBLICATIONS

International Search Report and Written Opinion of PCT Application No. PCT/JP2018/035382, dated Dec. 25, 2018, 9 pages of ISRWO.

*Primary Examiner* — Don P Le
(74) *Attorney, Agent, or Firm* — Chip Law Group

(57) ABSTRACT

A semiconductor circuit of the present disclosure includes: a volatile first storage section; a volatile second storage section that stores data stored in the first storage section on the basis of a first control signal; a non-volatile third storage section that stores data according to data stored in the second storage section on the basis of a second control signal, and causes the first storage section to store data stored in itself on the basis of a third control signal; and a control section that generates the first control signal and the third control signal, and compares the data stored in the first storage section and the data stored in the second storage section with each other to generate the second control signal on the basis of a result of the comparison.

14 Claims, 25 Drawing Sheets

(58) Field of Classification Search
 USPC .......................................................... 326/81
 See application file for complete search history.

(56) References Cited

U.S. PATENT DOCUMENTS

| | | | |
|---|---|---|---|
| 2003/0112047 A1* | 6/2003 | Dike | ................ H03K 3/356113 |
| | | | 327/202 |
| 2004/0036517 A1* | 2/2004 | Ahn | ..................... H03K 3/0372 |
| | | | 327/202 |
| 2005/0104643 A1* | 5/2005 | Tran | ....................... H03K 3/012 |
| | | | 327/217 |
| 2010/0001774 A1* | 1/2010 | Djaja | ................... H03K 3/0375 |
| | | | 327/202 |
| 2011/0122709 A1 | 5/2011 | Kim et al. | |
| 2011/0273925 A1 | 11/2011 | Yamamoto et al. | |
| 2012/0294069 A1 | 11/2012 | Ohmaru et al. | |
| 2014/0204696 A1* | 7/2014 | Kato | ....................... G11C 11/24 |
| | | | 365/228 |
| 2014/0293711 A1 | 10/2014 | Kato et al. | |
| 2019/0305761 A1* | 10/2019 | Huang | ............... H03K 19/0016 |
| 2020/0106425 A1* | 4/2020 | Venugopal | ............. H03K 3/012 |

FOREIGN PATENT DOCUMENTS

| | | |
|---|---|---|
| JP | 2014-209726 A | 11/2014 |
| JP | 2014-222425 A | 11/2014 |
| KR | 10-2011-0057601 A | 6/2011 |

* cited by examiner

[FIG. 1]
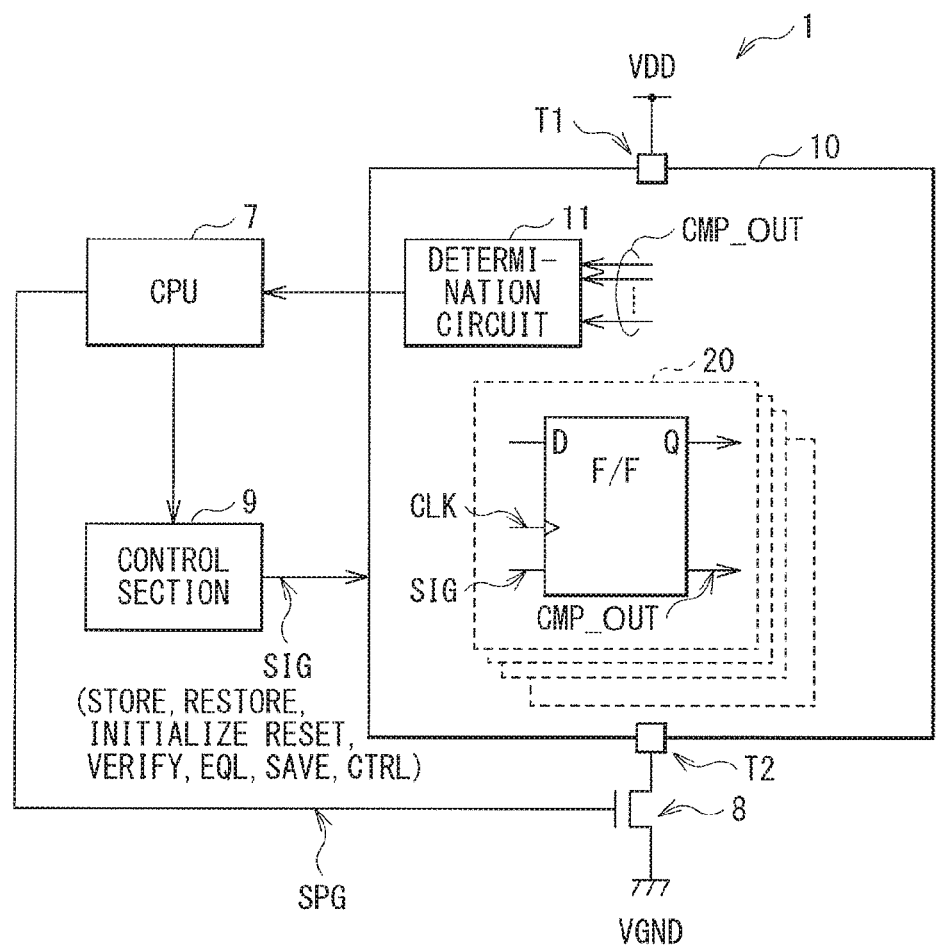

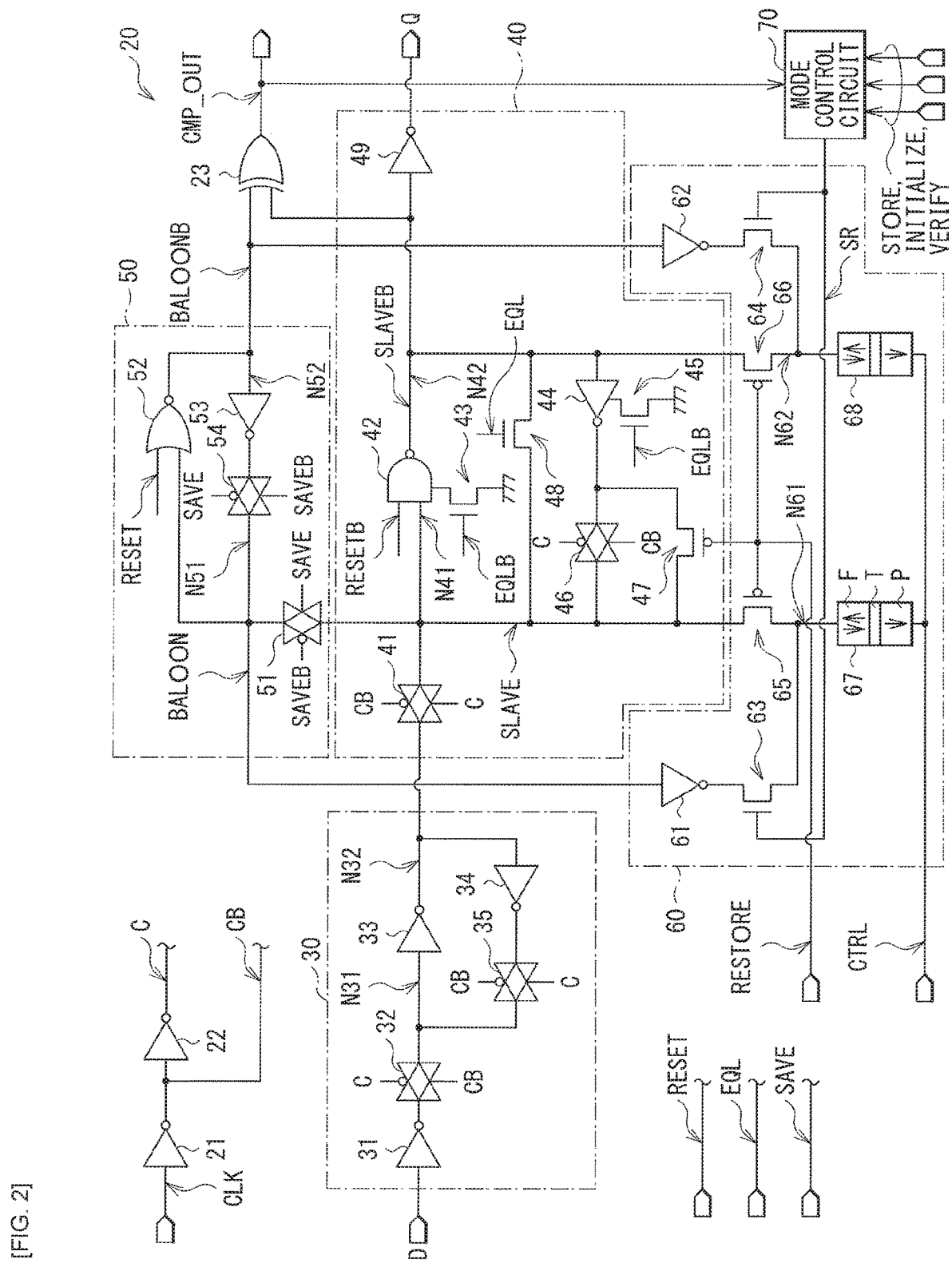
[FIG. 2]

[FIG. 3]
| SLAVEB | BALOONB | CMP_OUT | OPERATION MODE |
|---|---|---|---|
| 0 | 0 | 0 | VERIFY MODE |
| 0 | 1 | 1 | STORE MODE |
| 1 | 0 | 1 | STORE MODE |
| 1 | 1 | 0 | VERIFY MODE |
[FIG. 4]
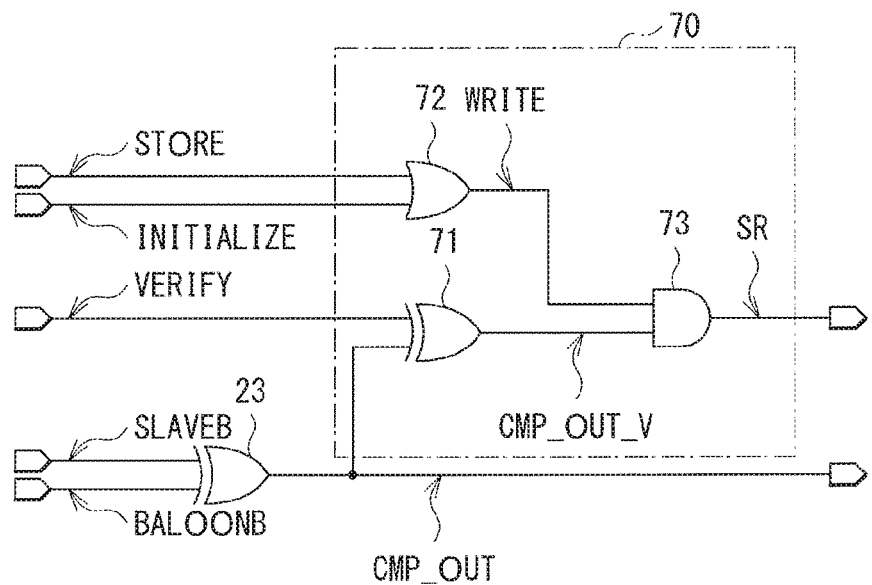

[FIG. 5A]

| CMP_OUT | VERIFY | CMP_OUT_V | OPERATION |
|---|---|---|---|
| 1 | 0 | 1 | Write |
| 0 | 0 | 0 | Finish |
| 1 | 1 | 0 | Finish |
| 0 | 1 | 1 | Verify |

[FIG. 5B]

| STORE | INITIALIZE | WRITE |
|---|---|---|
| 0 | 0 | 0 |
| 0 | 1 | 1 |
| 1 | 0 | 1 |
| 1 | 1 | 1 |

[FIG. 5C]

| CMP_OUT_V | WRITE | SR | OPERATION |
|---|---|---|---|
| 0 | 0 | 0 | TRANSISTORS 63 AND 64 ARE IN OFF STATE |
| 0 | 1 | 0 | TRANSISTORS 63 AND 64 ARE IN OFF STATE |
| 1 | 0 | 0 | TRANSISTORS 63 AND 64 ARE IN OFF STATE |
| 1 | 1 | 1 | TRANSISTORS 63 AND 64 ARE IN ON STATE |

[FIG. 6A]
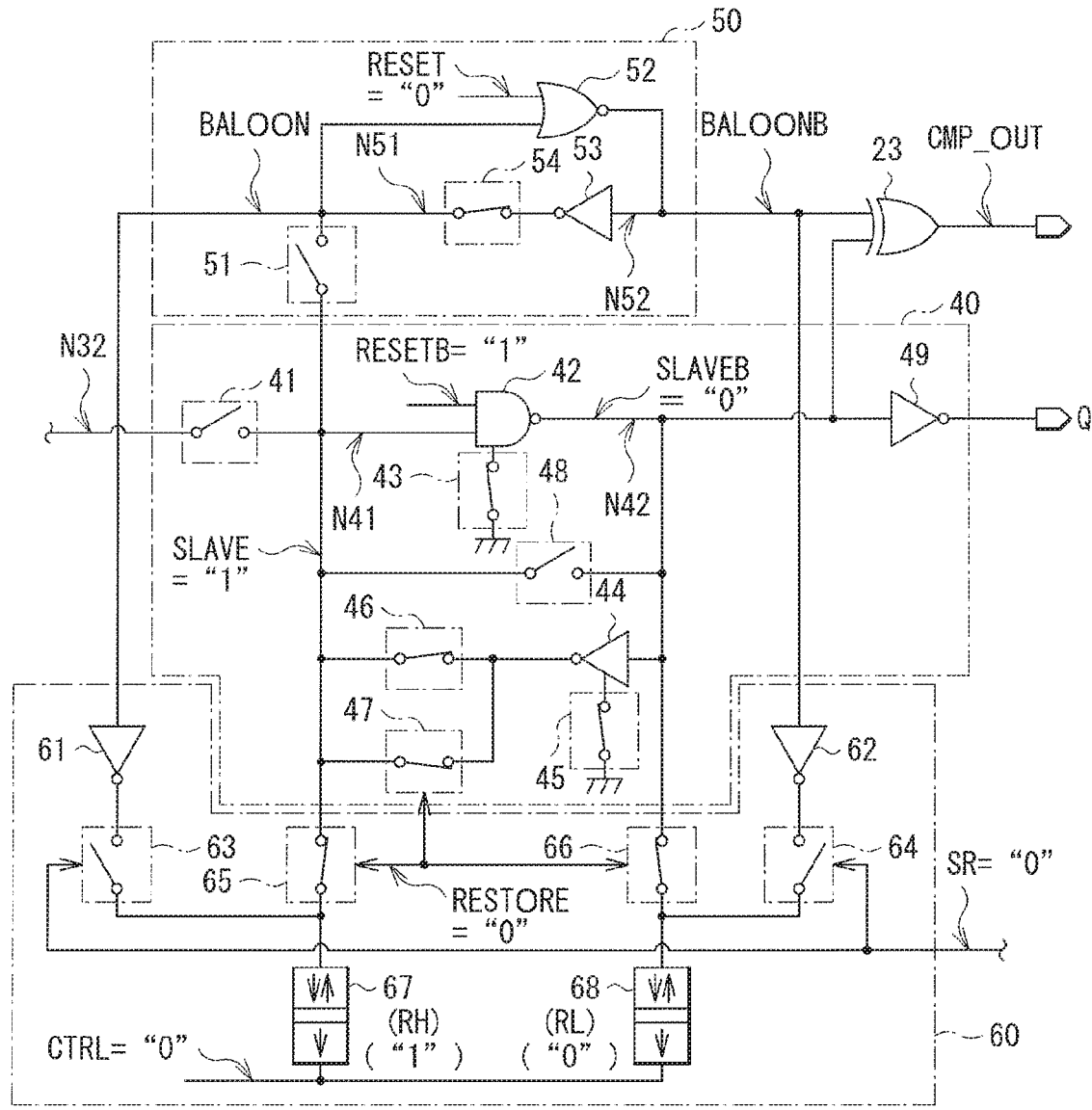

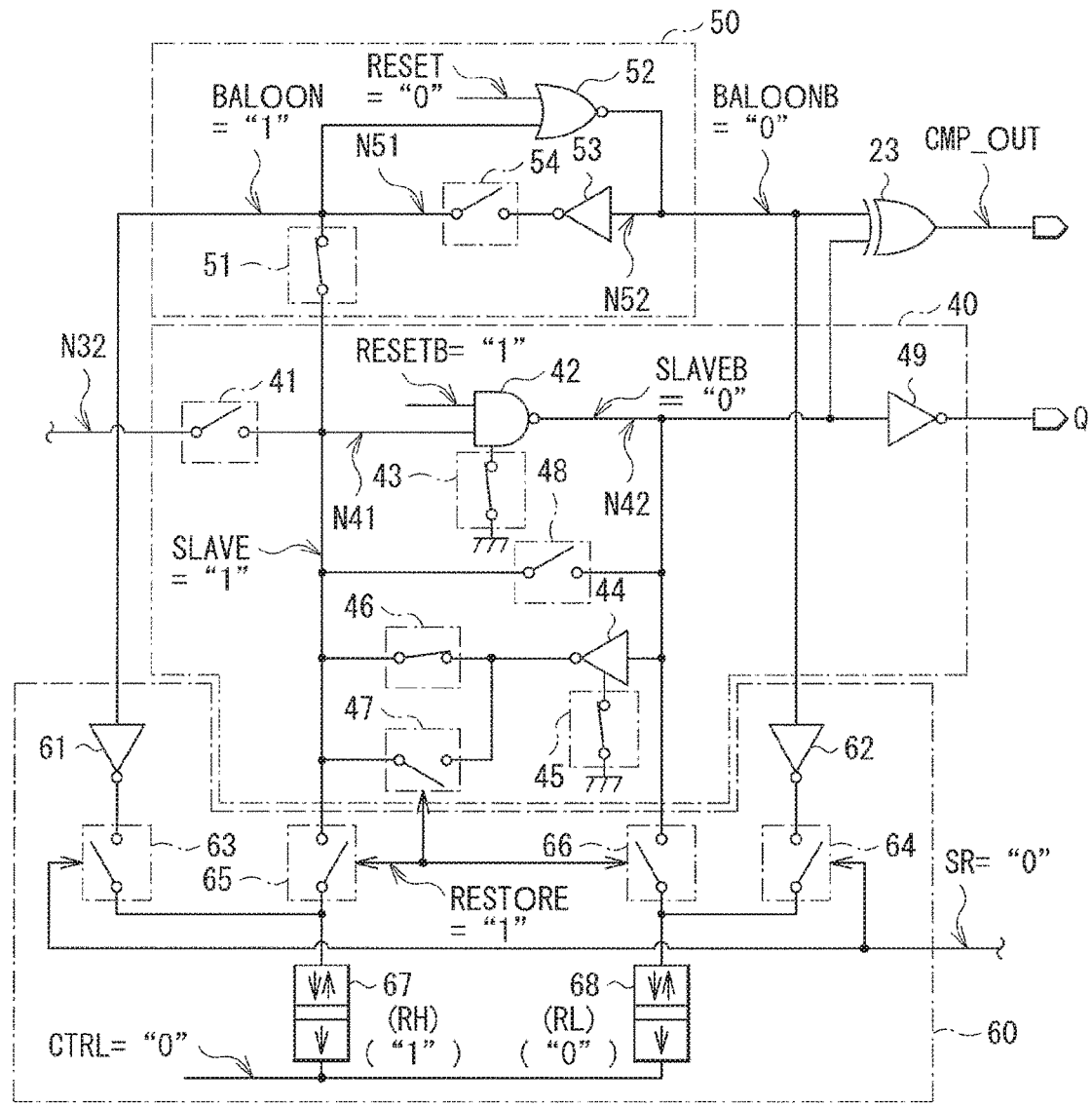
[FIG. 6B]

[FIG. 6C]
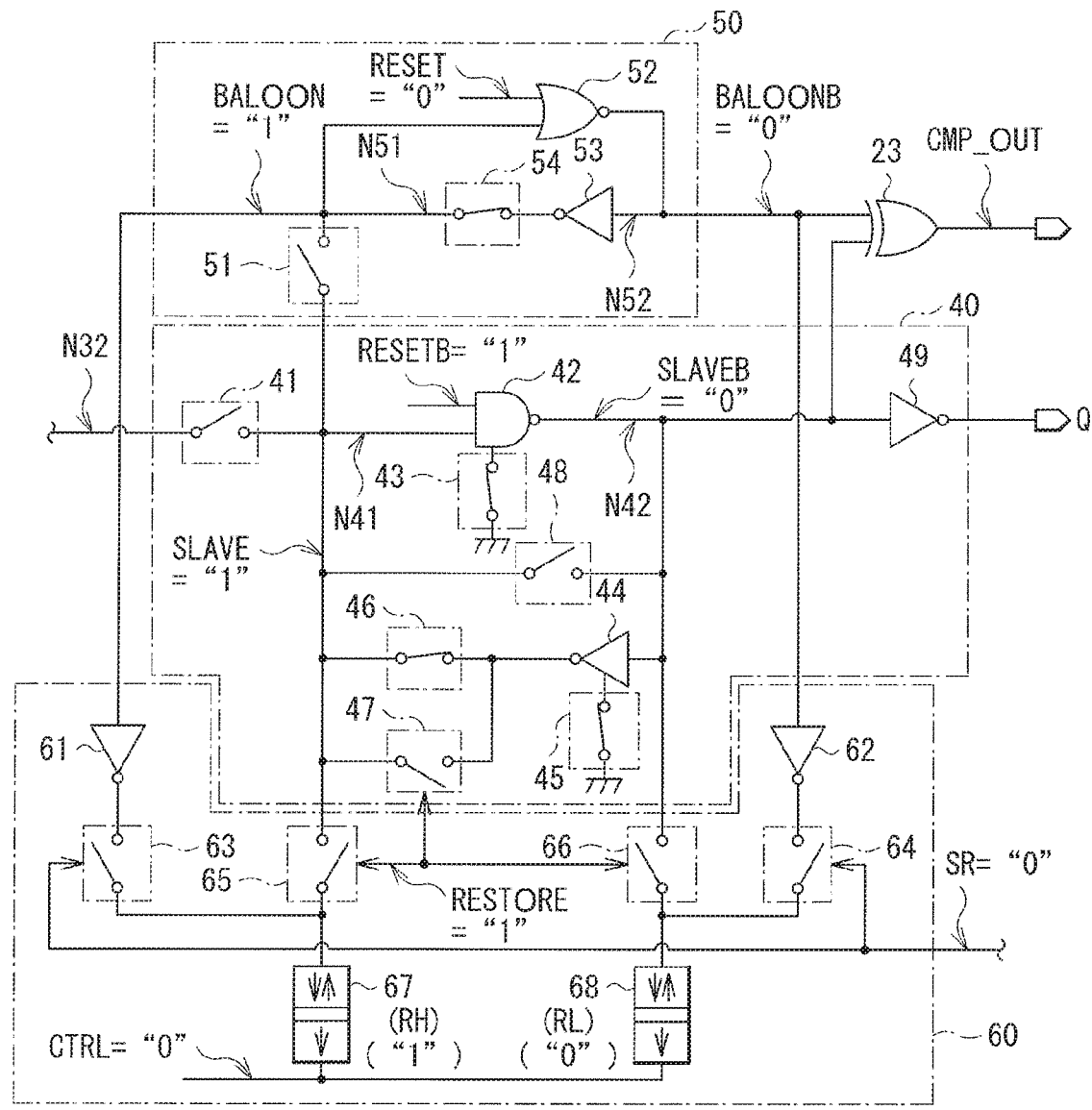

[FIG. 6D]
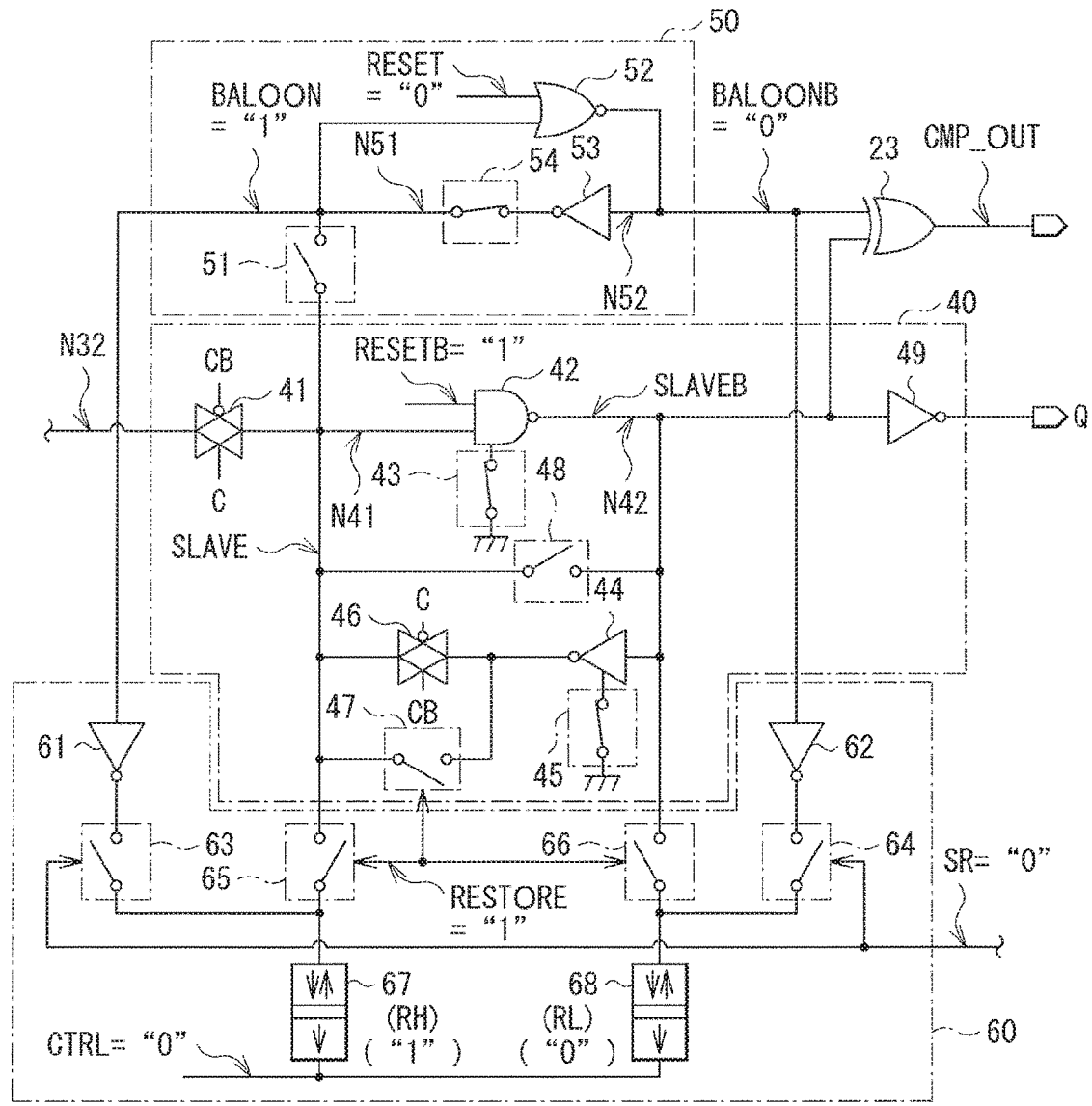

[FIG. 6E]
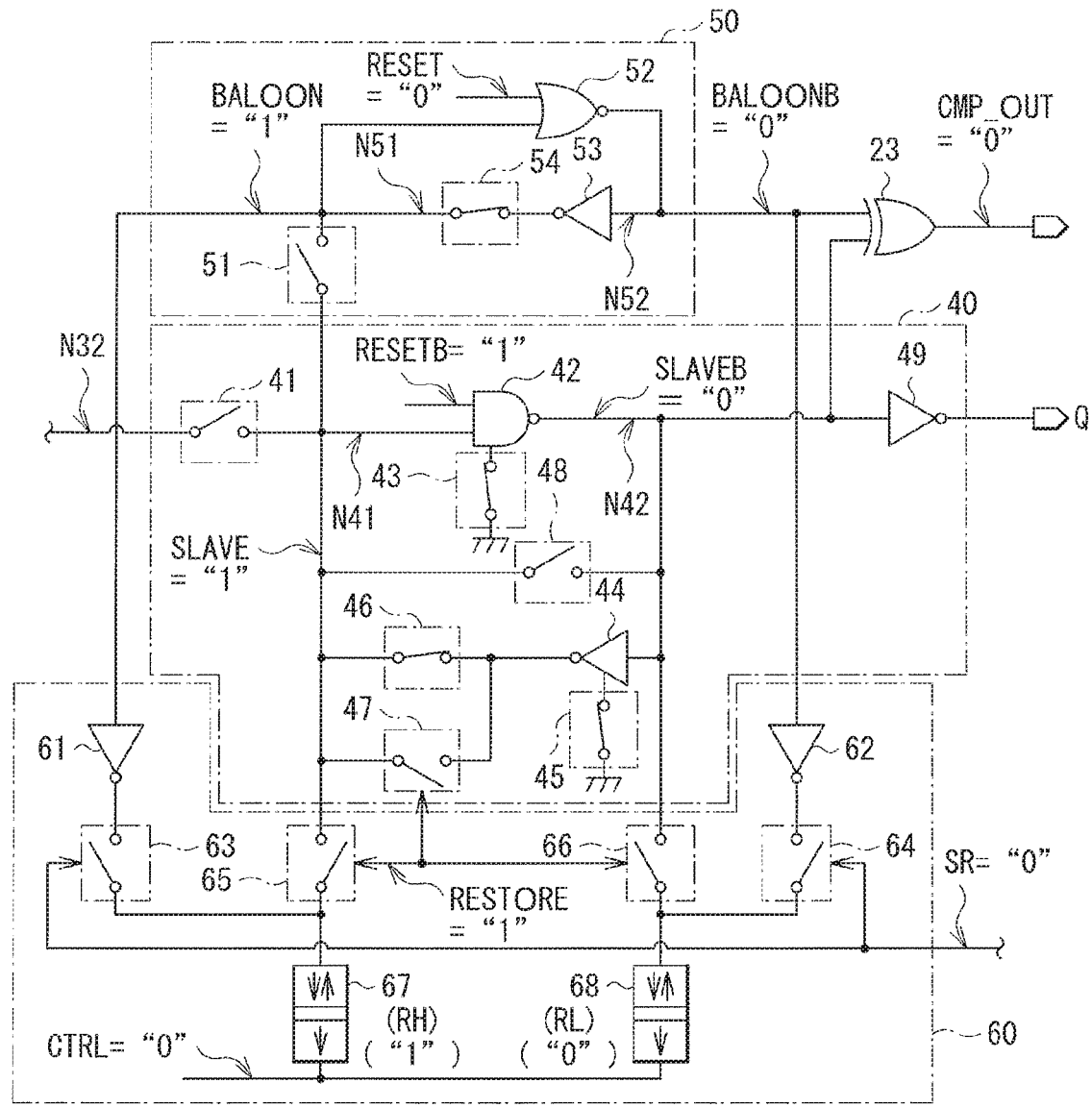

[FIG. 6F]
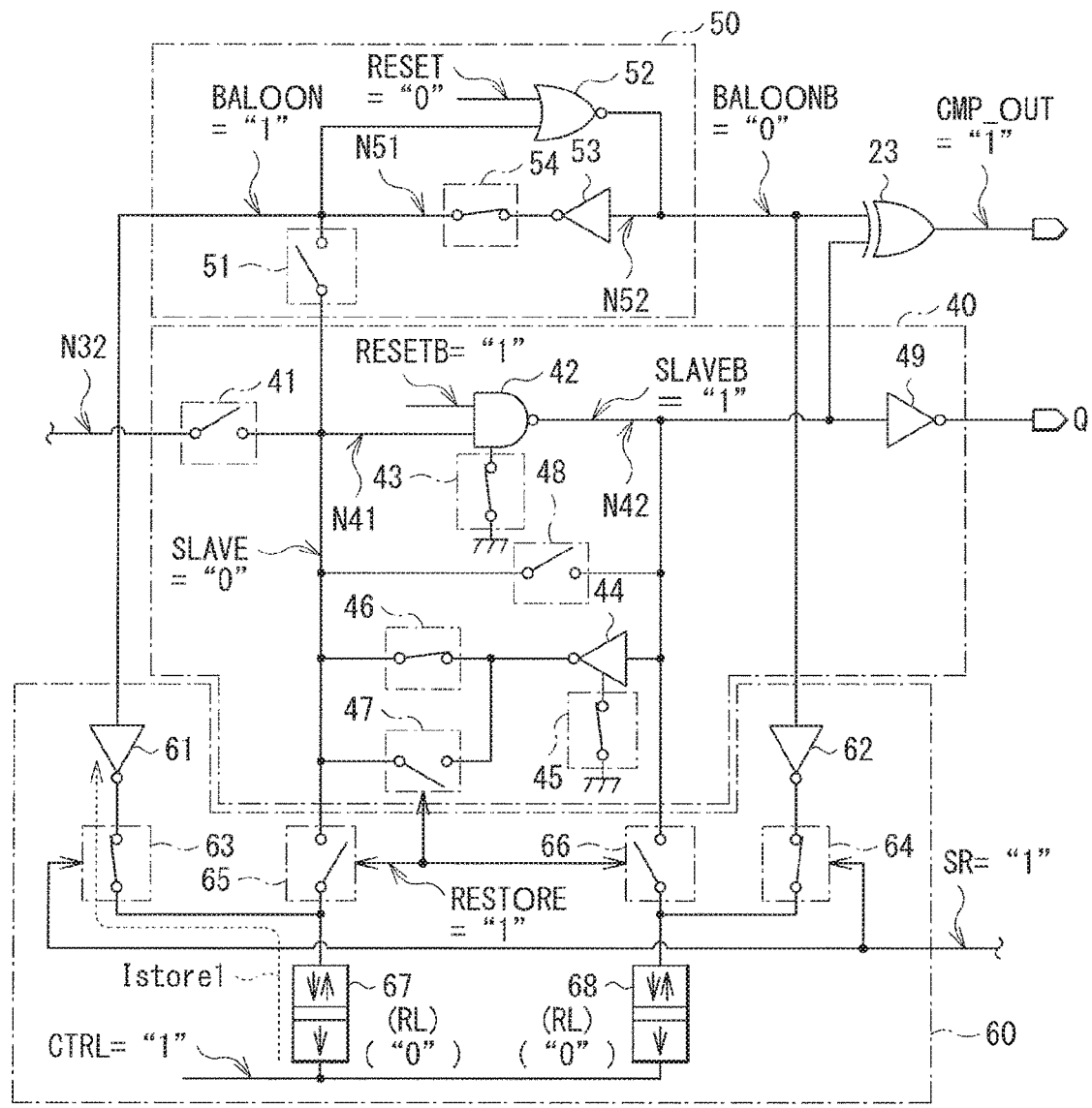

[FIG. 6G]
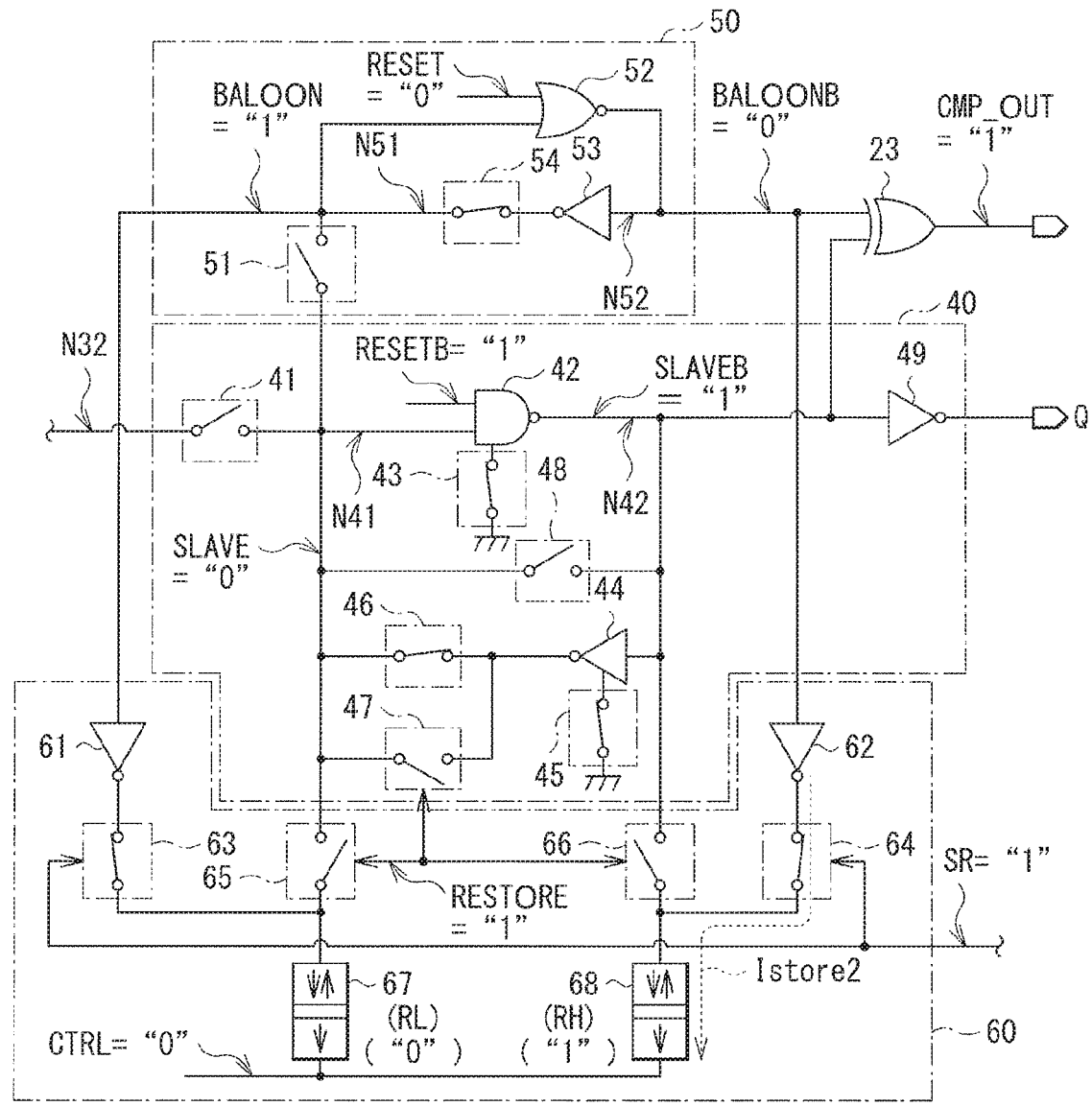

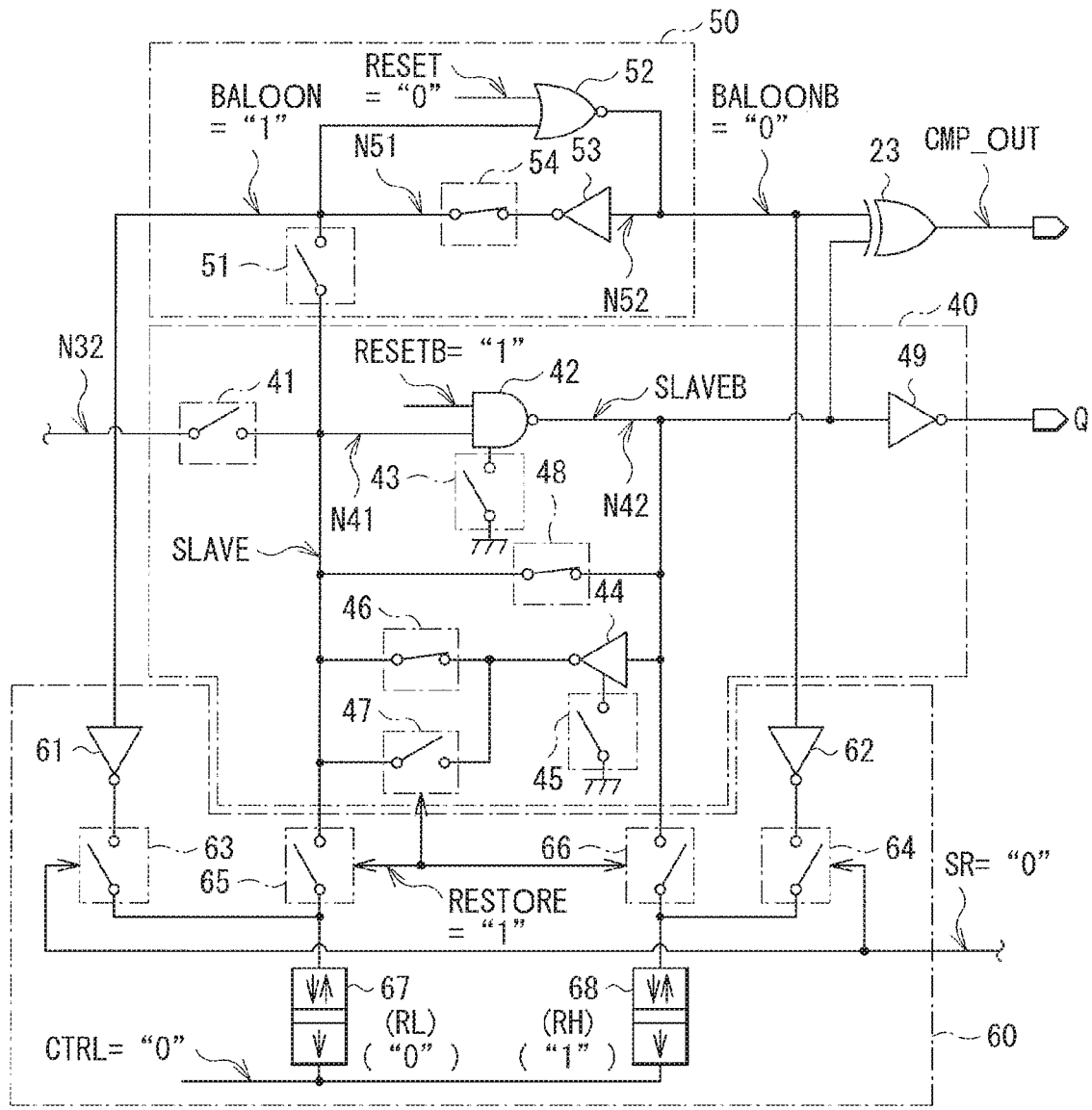
[FIG. 6H]

[FIG. 6I]
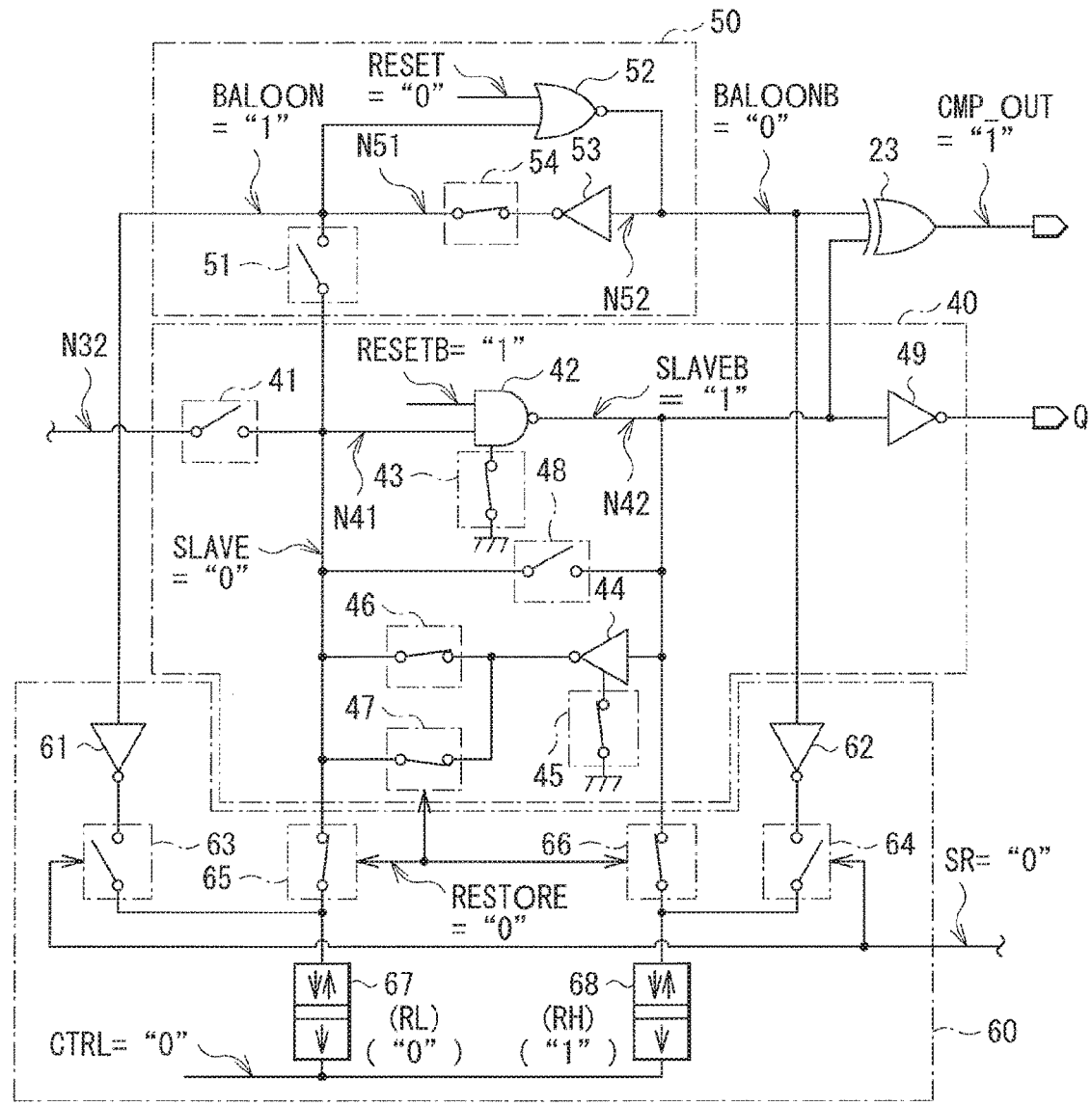

[FIG. 6J]
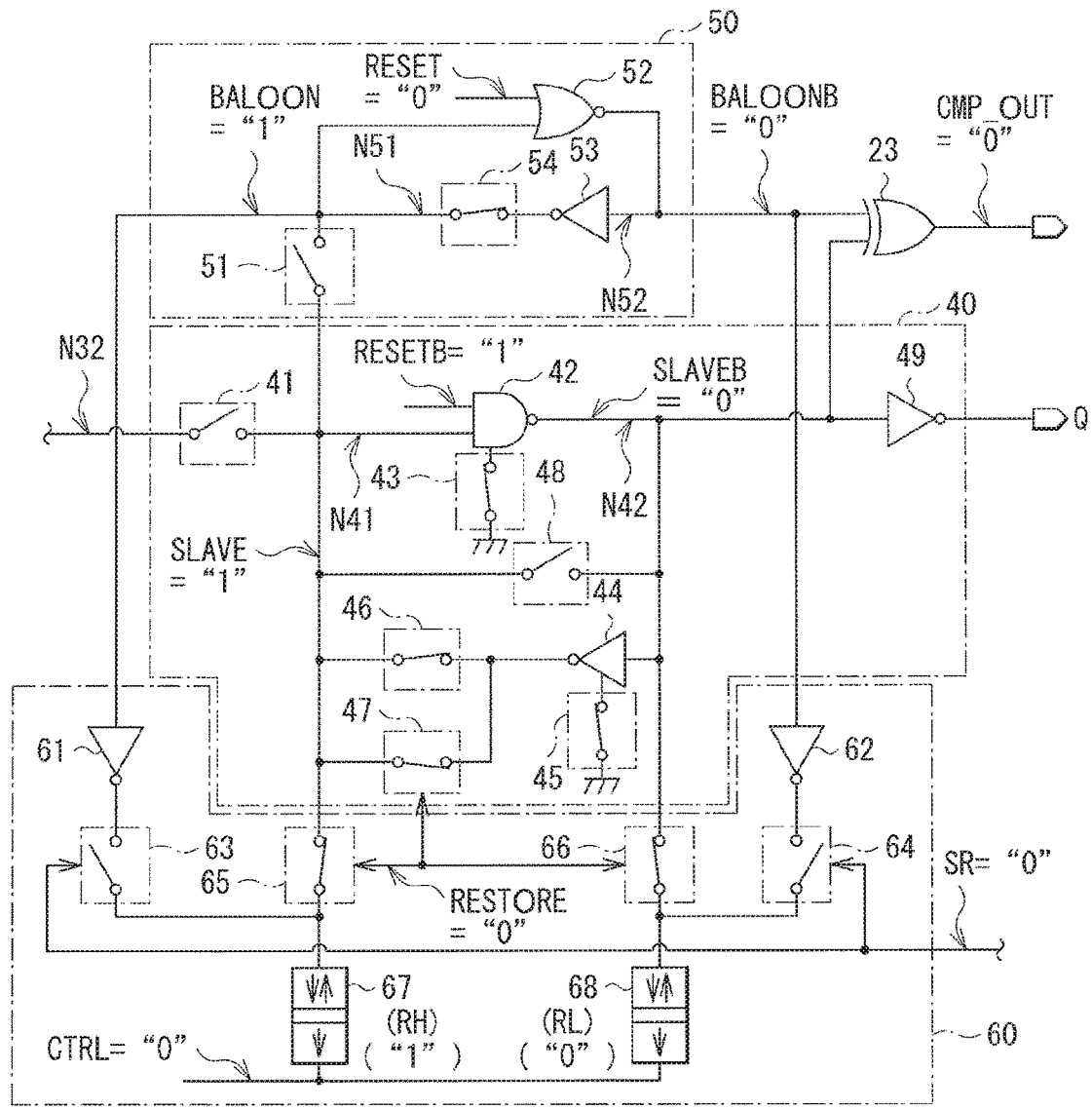

[FIG. 7A]
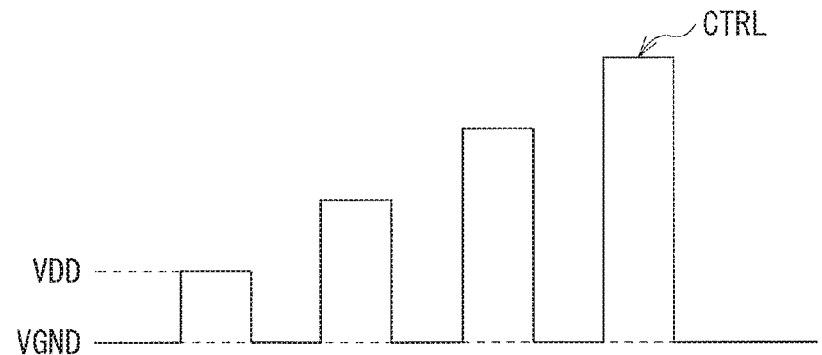
[FIG. 7B]
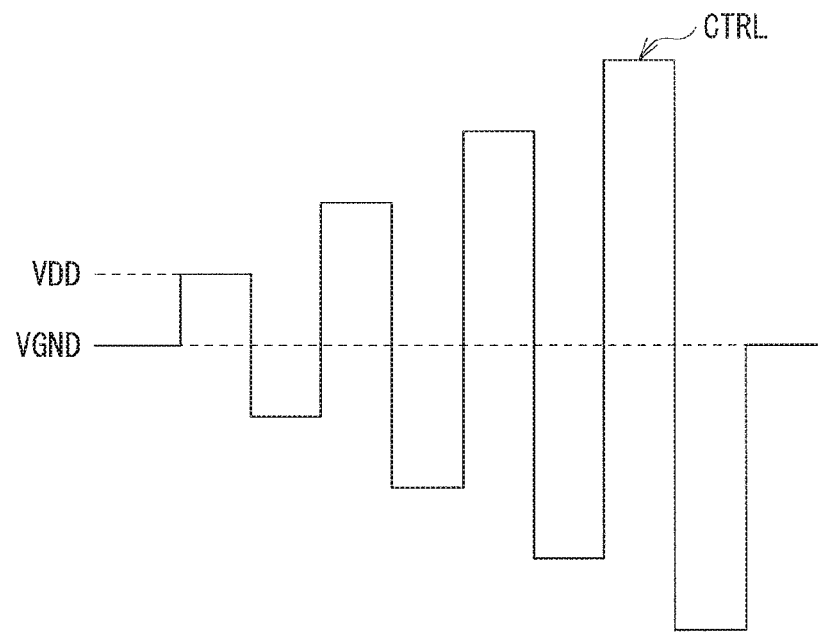

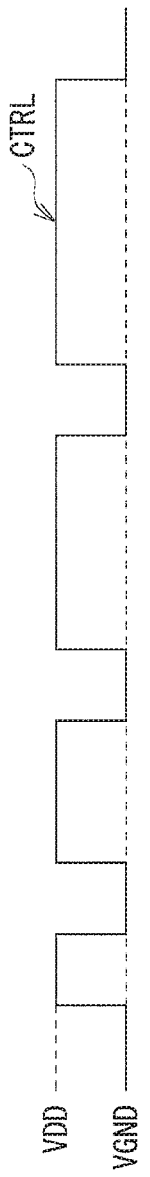
[FIG. 8A]

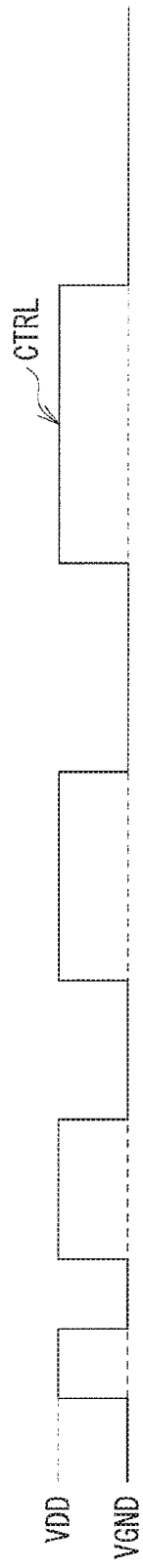

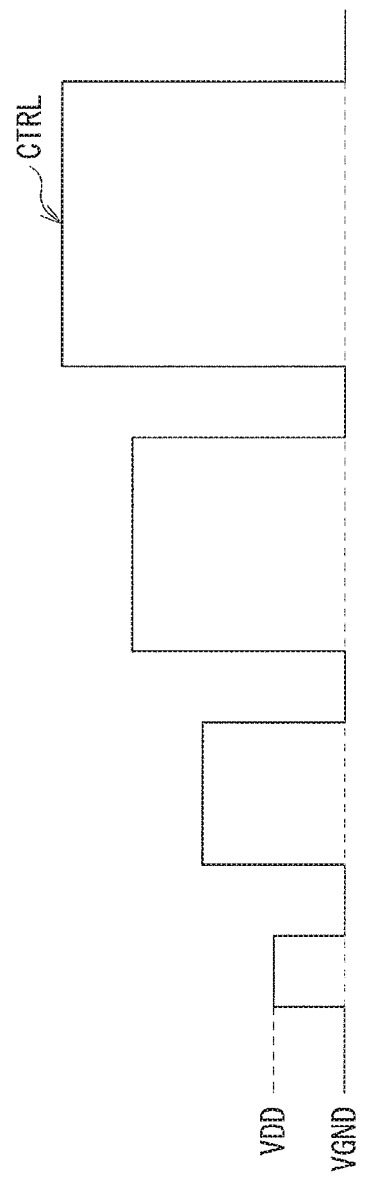
[FIG. 9]

[FIG. 10A]
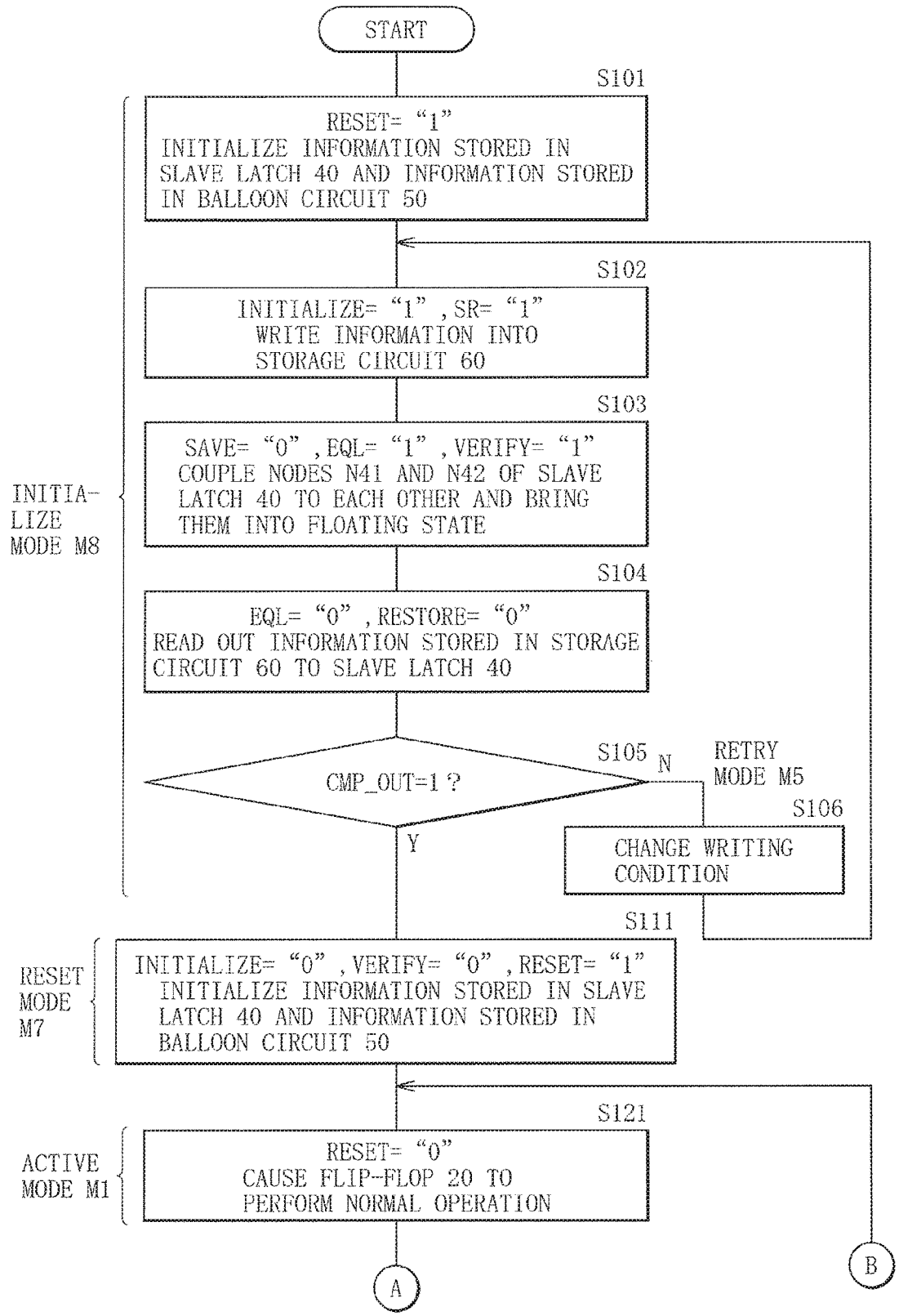

[FIG. 10B]
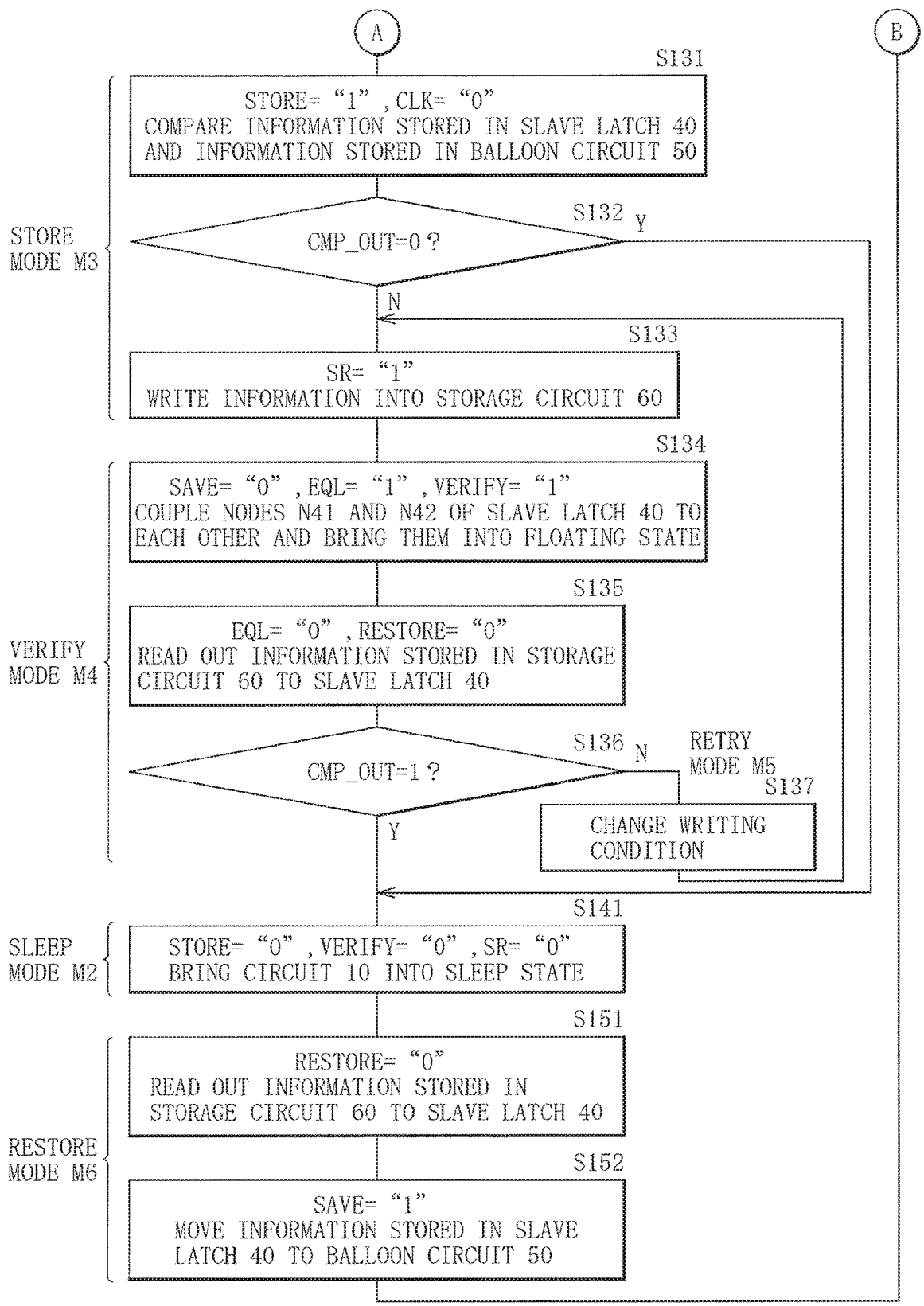

[FIG. 11]
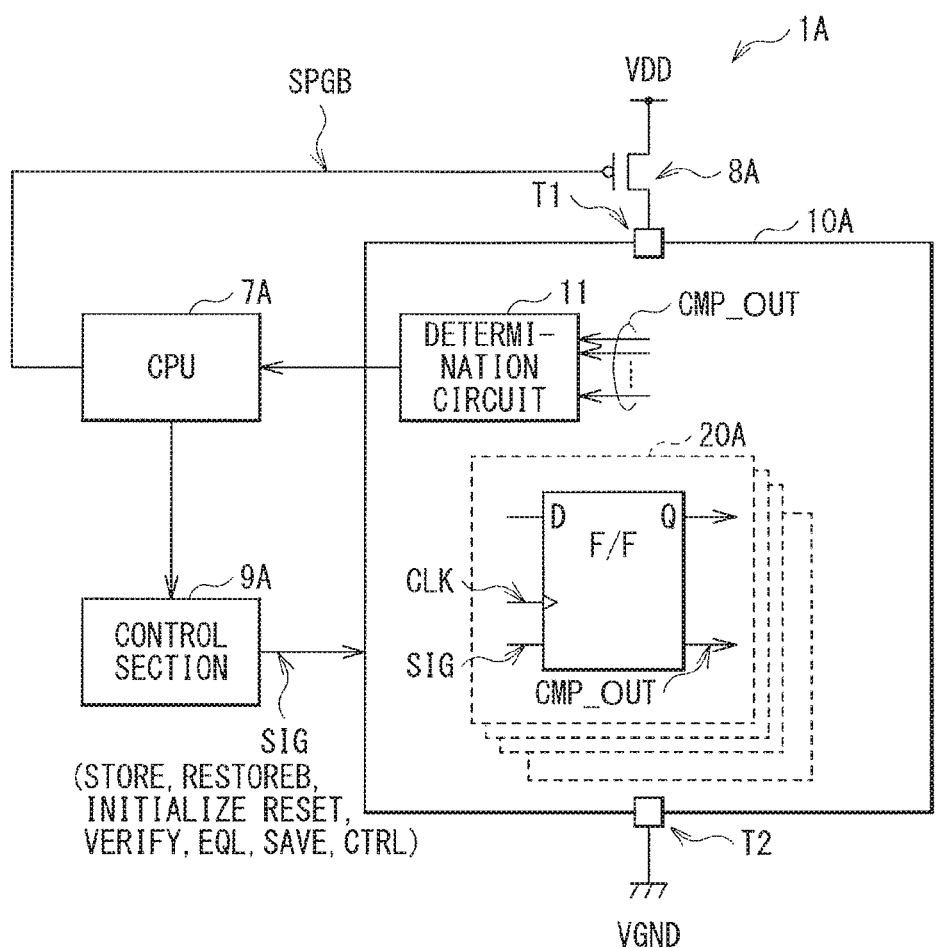

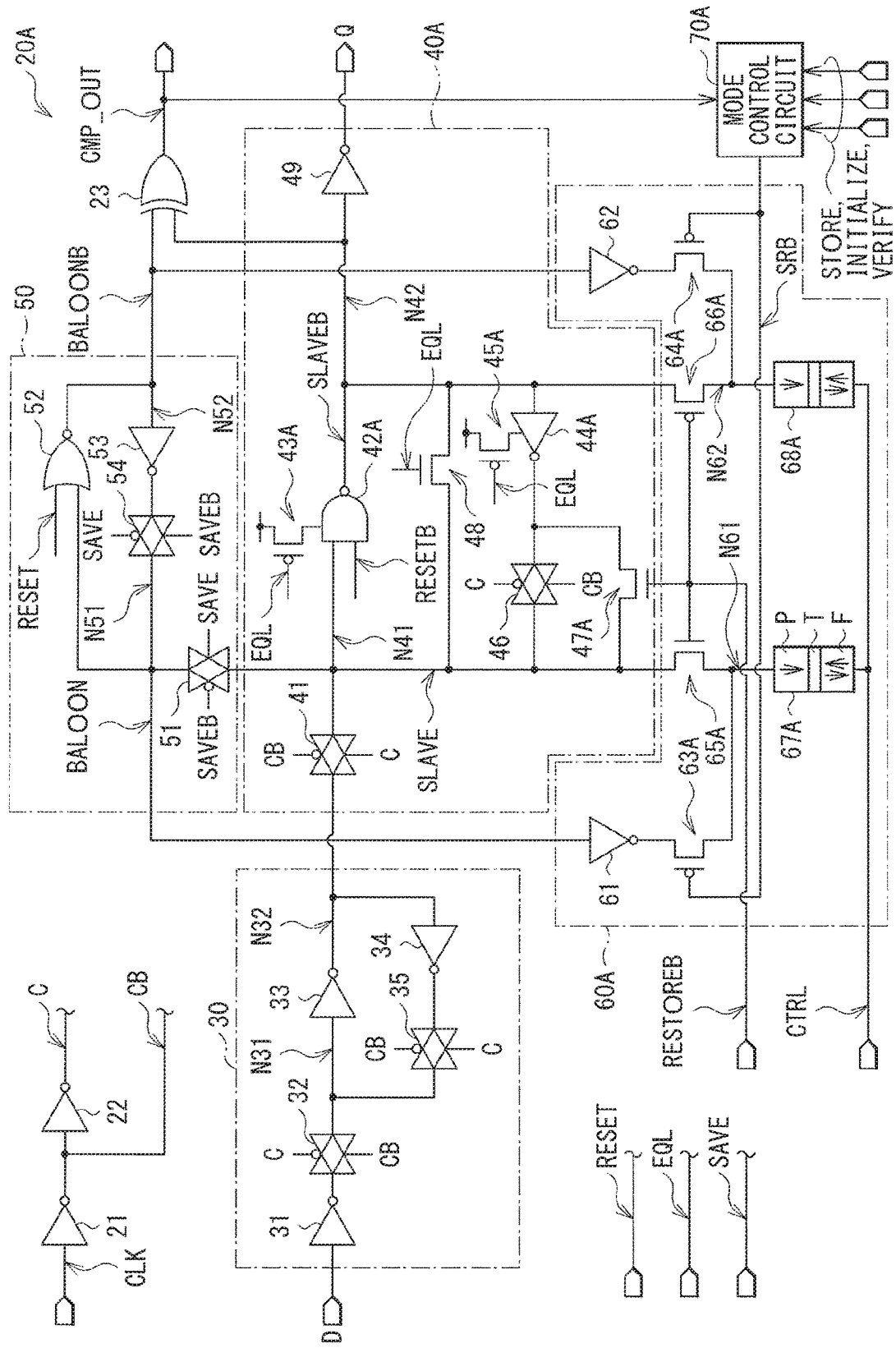
[FIG. 12]

[FIG. 13]
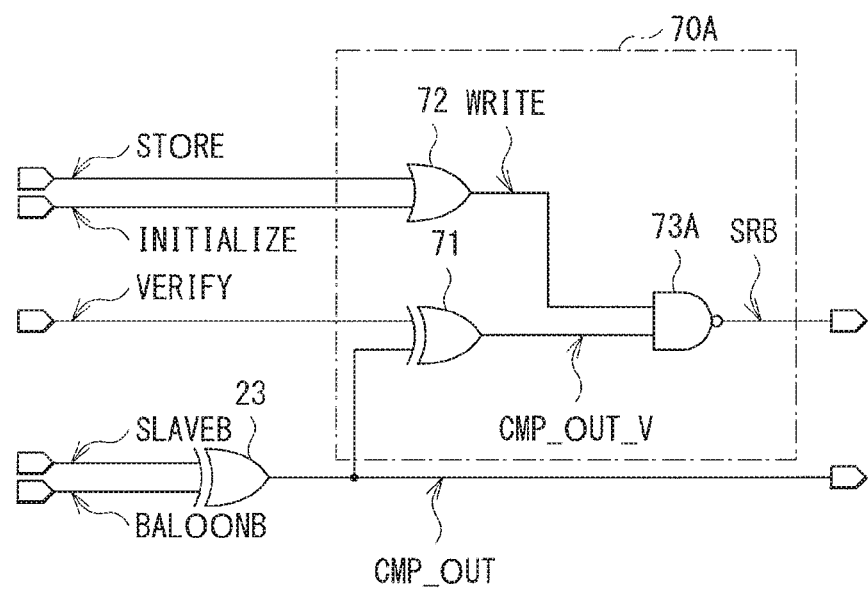

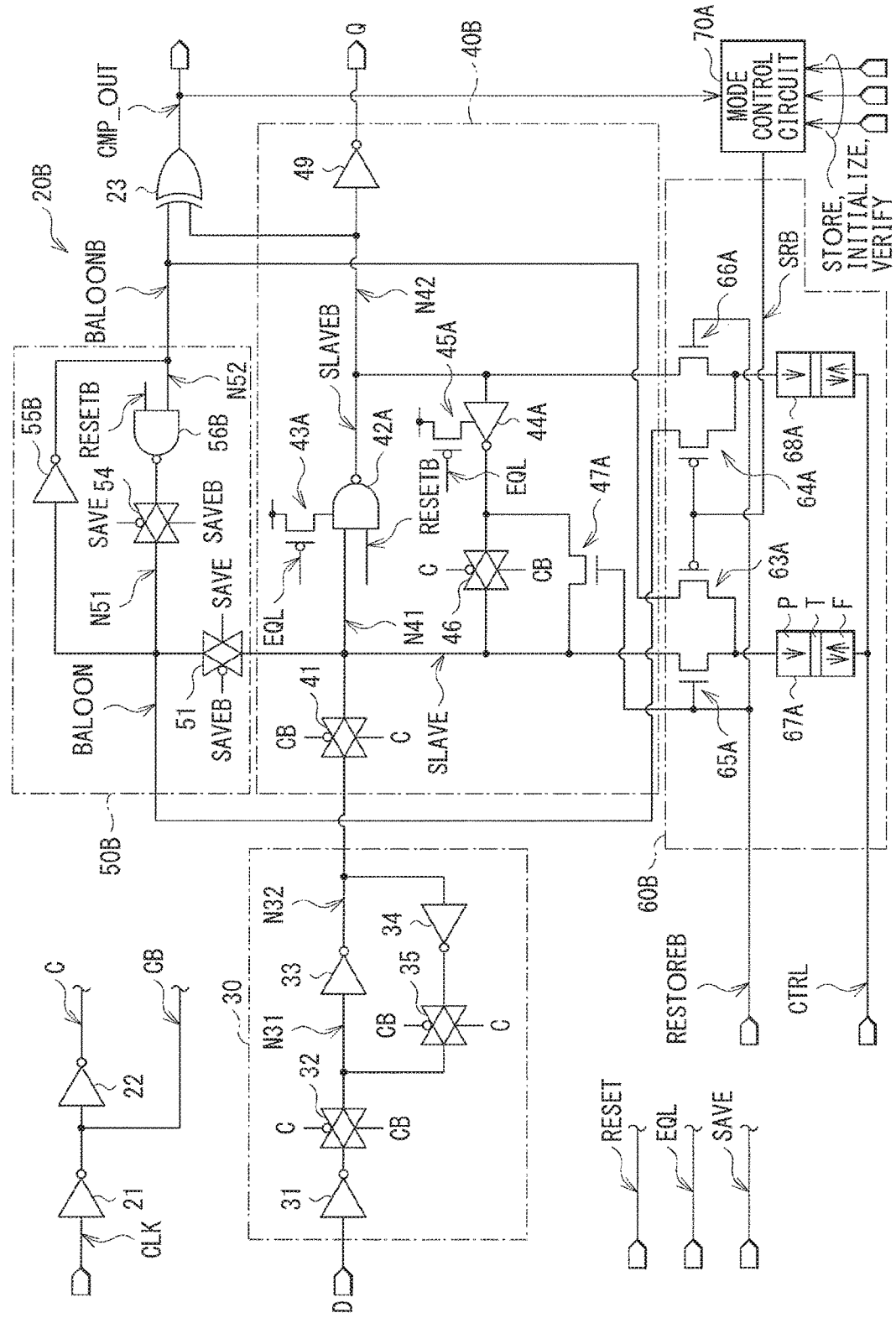
[FIG. 14]

[FIG. 15]
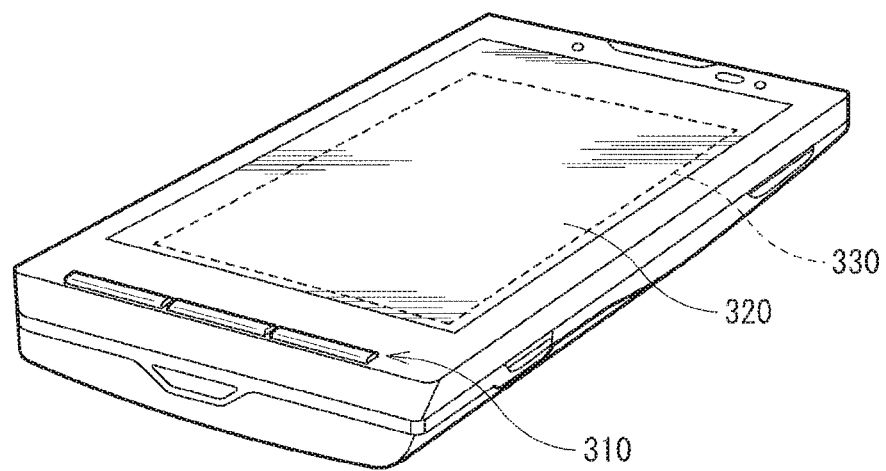

SEMICONDUCTOR CIRCUIT AND METHOD OF CONTROLLING SAME

CROSS REFERENCE TO RELATED APPLICATIONS

This application is a U.S. National Phase of International Patent Application No. PCT/JP2018/035382 filed on Sep. 25, 2018, which claims priority benefit of Japanese Patent Application No. JP2017-197486 filed in the Japan Patent Office on Oct. 11, 2017. Each of the above-referenced applications is hereby incorporated herein by reference in its entirety.

TECHNICAL FIELD

The present disclosure relates to a semiconductor circuit including a non-volatile storage element, and a method of controlling such a semiconductor circuit.

BACKGROUND ART

Electronic apparatuses are desired to have low power consumption from the viewpoint of ecology. In a semiconductor circuit, for example, a so-called power gating technique is often used in which power consumption is reduced by selectively stopping power supply to some circuit. It is desired, for the circuit in which the power supply is stopped in this manner, to return to an operation status prior to the stopping of the power supply immediately after the power supply is restarted. One method for achieving such a short-time returning operation is a method in which a non-volatile storage element is incorporated in a circuit (e.g., PTL 1, etc.).

CITATION LIST

Patent Literature

PTL 1: U.S. Patent Application Publication No. 2011/0273925

SUMMARY OF THE INVENTION

As described above, electronic apparatuses are desired to have reduced power consumption, and semiconductor circuits are also expected to have further reduced power consumption.

It is desirable to provide a semiconductor circuit and a method of controlling the semiconductor circuit that make it possible to reduce power consumption.

A semiconductor circuit according to an embodiment of the present disclosure includes a first storage section, a second storage section, a third storage section, and a control section. The first storage section is volatile. The second storage section is volatile, and stores data stored in the first storage section on the basis of a first control signal. The third storage section is non-volatile, and stores data according to data stored in the second storage section on the basis of a second control signal and causes the first storage section to store data stored in itself on the basis of a third control signal. The control section generates the first control signal and the third control signal, and compares the data stored in the first storage section and the data stored in the second storage section with each other to generate the second control signal on the basis of a result of the comparison.

A method of controlling a semiconductor circuit according to an embodiment of the present disclosure includes: comparing data stored in a volatile first storage section and data stored in a volatile second storage section that stores the data stored in the first storage section on the basis of a first control signal; and supplying a second control signal to a non-volatile third storage section on the basis of a result of the comparison between the data stored in the first storage section and the data stored in the second storage section to thereby cause the third storage section to store data according to the data stored in the second storage section.

In the semiconductor circuit and the method of controlling the semiconductor circuit according to respective embodiments of the present disclosure, data is stored in the volatile first storage section. In addition, the data stored in the first storage section is stored in the volatile second storage section on the basis of the first control signal, and data according to the data stored in the second storage section is stored in the non-volatile third storage section on the basis of the second control signal. The second control signal is generated on the basis of the result of the comparison between the data stored in the first storage section and the data stored in the second storage section.

According to the semiconductor circuit and the method of controlling the semiconductor circuit in the respective embodiments of the present disclosure, the data stored in the first storage section and the data stored in the second storage section are compared with each other to generate the second control signal on the basis of the result of the comparison, thus making it possible to reduce the power consumption. It is to be noted that the effects described here are not necessarily limited, and may be any of the effects described in the present disclosure.

BRIEF DESCRIPTION OF THE DRAWINGS

FIG. 1 is a block diagram illustrating a configuration example of a semiconductor circuit according to an embodiment of the present disclosure.

FIG. 2 is a circuit diagram illustrating a configuration example of a flip-flop illustrated in FIG. 1.

FIG. 3 is a truth table illustrating an operation example of an exclusive OR circuit illustrated in FIG. 2.

FIG. 4 is a circuit diagram illustrating a configuration example of a mode control circuit illustrated in FIG. 2.

FIG. 5A is a truth table illustrating an operation example of the mode control circuit illustrated in FIG. 4.

FIG. 5B is another truth table illustrating an operation example of the mode control circuit illustrated in FIG. 4.

FIG. 5C is another truth table illustrating an operation example of the mode control circuit illustrated in FIG. 4.

FIG. 6A is an explanatory diagram illustrating an operation example of the flip-flop illustrated in FIG. 2.

FIG. 6B is another explanatory diagram illustrating an operation example of the flip-flop illustrated in FIG. 2.

FIG. 6C is another explanatory diagram illustrating an operation example of the flip-flop illustrated in FIG. 2.

FIG. 6D is another explanatory diagram illustrating an operation example of the flip-flop illustrated in FIG. 2.

FIG. 6E is another explanatory diagram illustrating an operation example of the flip-flop illustrated in FIG. 2.

FIG. 6F is another explanatory diagram illustrating an operation example of the flip-flop illustrated in FIG. 2.

FIG. 6G is another explanatory diagram illustrating an operation example of the flip-flop illustrated in FIG. 2.

FIG. 6H is another explanatory diagram illustrating an operation example of the flip-flop illustrated in FIG. 2.

FIG. 6I is another explanatory diagram illustrating an operation example of the flip-flop illustrated in FIG. 2.

FIG. 6J is another explanatory diagram illustrating an operation example of the flip-flop illustrated in FIG. 2.

FIG. 7A is a waveform diagram illustrating an operation example of the semiconductor circuit illustrated in FIG. 1.

FIG. 7B is a waveform diagram illustrating another operation example of the semiconductor circuit illustrated in FIG. 1.

FIG. 8A is a waveform diagram illustrating another operation example of the semiconductor circuit illustrated in FIG. 1.

FIG. 8B is a waveform diagram illustrating another operation example of the semiconductor circuit illustrated in FIG. 1.

FIG. 9 is a waveform diagram illustrating another operation example of the semiconductor circuit illustrated in FIG. 1.

FIG. 10A is a flowchart illustrating an operation example of the semiconductor circuit illustrated in FIG. 1.

FIG. 10B is another flowchart illustrating an operation example of the semiconductor circuit illustrated in FIG. 1.

FIG. 11 is a block diagram illustrating a configuration example of a semiconductor circuit according to a modification example.

FIG. 12 is a circuit diagram illustrating a configuration example of a flip-flop illustrated in FIG. 11.

FIG. 13 is a circuit diagram illustrating a configuration example of a mode control circuit illustrated in FIG. 12.

FIG. 14 is a circuit diagram illustrating a configuration example of a flip-flop according to another modification example.

FIG. 15 is a perspective view of an external configuration of a smartphone to which an embodiment is applied.

MODES FOR CARRYING OUT THE INVENTION

Hereinafter, description is given in detail of embodiments of the present disclosure with reference to the drawings. It is to be noted that the description is given in the following order.
1. Embodiments
2. Application examples

1. Embodiments

Configuration Example

FIG. 1 illustrates a configuration example of a semiconductor circuit (a semiconductor circuit 1) according to an embodiment. The semiconductor circuit 1 includes a non-volatile storage element, and is configured to be able to return to an operation status prior to stopping of power supply after the power supply is restarted. It is to be noted that a driving method of the semiconductor circuit according to an embodiment of the present disclosure is achieved by the present embodiment, and therefore description is given of the driving method together. The semiconductor circuit 1 includes a circuit 10, a power transistor 8, a CPU (Central Processing Unit) 7, and a control section 9. It is to be noted that this is not limitative; for example, the circuit 10 may include some circuit of the control section 9.

The circuit 10 is a circuit that performs a predetermined operation. The circuit 10 includes a power supply terminal T1 supplied with a power supply voltage VDD and a grounding terminal T2 grounded via the power transistor 8. This causes a ground voltage VGND to be supplied to the grounding terminal of each circuit in the circuit 10 when the power transistor 8 is in an on state. The circuit 10 includes a plurality of flip-flops (F/F) 20 and a determination circuit 11.

In an active mode M1, the flip-flop 20 samples a signal inputted to a data input terminal D on the basis of a rising edge of a clock signal CLK, and outputs a sampling result thereof out of a data output terminal Q. The flip-flop 20 includes a storage circuit 60 (described later) including non-volatile storage elements 67 and 68, as described later, and stores an operation status of the flip-flop 20 in the storage circuit 60 while the power supply is stopped (sleep mode M2). This enables the flip-flop 20 to return to an operation status prior to stopping of the power supply, immediately after the power supply is restarted.

In a case where the operation mode is shifted from the active mode M1 to the sleep mode M2, the flip-flop 20 writes information stored in a slave latch 40 (described later) of the flip-flop 20 into the storage circuit 60 (described later) on the basis of a control signal SIG including a plurality of signals supplied from the control section 9 (store mode M3). Then, the flip-flop 20 verifies whether or not the information has been able to be written normally into the storage circuit 60 (verify mode M4); in a case where the information has not been able to be written normally into the storage circuit 60, the flip-flop 20 repeats writing of the information while changing a writing condition until the information is able to be written normally (retry mode M5). On the other hand, in a case where the operation mode is shifted from the sleep mode M2 to the active mode M1, the flip-flop 20 reads out information from the storage circuit 60 to the slave latch 40 (restore mode M6). Further, the flip-flop 20 also has a function of resetting the slave latch 40 and a balloon circuit 50 (described later) (reset mode M7) and a function of initializing the storage circuit 60 at the time of shipment from the factory, for example (initialize mode M8). In this manner, the flip-flop 20 operates in eight operation modes (active mode M1, sleep mode M2, store mode M3, verify mode M4, retry mode M5, restore mode M6, reset mode M7, and initialize mode M8). In addition, although description is given in detail later, the flip-flop 20 also has a function of comparing information stored in the slave latch 40 and information stored in the balloon circuit 50 with each other and outputting a result of the comparison as a signal CMP_OUT.

In the verify mode M4, the determination circuit 11 determines whether or not the information stored in the slave latch 40 (described later) has been able to be written normally into the storage circuit 60 in all the flip-flops 20, on the basis of the signals CMP_OUT supplied from the plurality of flip-flops 20. Then, the determination circuit 11 supplies a result of the determination to the CPU 7.

The power transistor 8 is turned on and off on the basis of the power control signal SPG. In this example, the power transistor 8 is an N-type MOS (Metal Oxide Semiconductor) transistor. The power transistor 8 includes a gate supplied with the power control signal SPG, a drain coupled to the grounding terminal T2 of the circuit 10, and a source supplied with the ground voltage VGND. In the semiconductor circuit 1, in a case where the circuit 10 is operated, the power transistor 8 is brought into an on state, and in a case where the circuit 10 is not operated, the power transistor 8 is brought into an off state. This makes it possible to reduce power consumption in the semiconductor circuit 1.

The CPU 7 controls operations of the semiconductor circuit 1. In addition, the CPU 7 also has a function of performing so-called power gating by supplying the power control signal SPG to the power transistor 8 and turning on and off the power transistor 8.

In this power gating, the CPU 7 instructs operation modes of the semiconductor circuit 1 by supplying a control signal to the control section 9. Specifically, in a case of shifting the operation mode from the active mode M1 to the sleep mode M2, the CPU 7 first instructs that the semiconductor circuit 1 should operate in the store mode M3, and next instructs that the semiconductor circuit 1 should operate in the verify mode M4. In the verify mode M4, on the basis of signals CMP_OUT supplied from the plurality of flip-flops 20, the determination circuit 11 determines whether or not the information stored in the slave latch 40 (described later) has been able to be written normally into the storage circuit 60 in all the flip-flops 20. In a case where it is recognized that some flip-flop 20 of the plurality of flip-flops 20 has not been able to write the information normally into the storage circuit 60 on the basis of a result of the determination in the determination circuit 11, the CPU 7 instructs that the semiconductor circuit 1 should operate in the retry mode M5. Consequently, the flip-flop 20 which has not been able to write the information normally into the storage circuit 60 repeats the writing of the information into the storage circuit 60 while changing the writing condition. In addition, in a case where all the flip-flops 20 write the information normally into the storage circuit 60, the CPU 7 brings the power transistor 8 into an off state. On the other hand, in a case of shifting the operation mode from the sleep mode M2 to the active mode M1, the CPU 7 first instructs that the semiconductor circuit 1 should operate in the restore mode M6, and next brings the power transistor 8 into an on state.

It is to be noted that, in the example illustrated above, in a case where the operation mode is shifted from the active mode M1 to the sleep mode M2, the semiconductor circuit 1 is operated in the store mode M3, but this is not limitative; for example, it may be possible to directly shift from the active mode M1 to the sleep mode M2 without going through the store mode M3. That is, it is possible for the semiconductor circuit 1 to perform various operations by freely combining these operation modes.

The control section 9 supplies the control signal SIG to each flip-flop 20 of the circuit 10 on the basis of an operation mode instructed by the CPU 7. The control signal SIG includes eight signals STORE, RESTORE, INITIALIZE, RESET, VERIFY, EQL, SAVE, and CTRL.

FIG. 2 illustrates a configuration example of the flip-flop 20. The flip-flop 20 includes inverters 21 and 22, a master latch 30, the slave latch 40, the balloon circuit 50, the storage circuit 60, an exclusive OR (EX-OR) circuit 23, and a mode control circuit 70. Although not illustrated, the flip-flop 20 also includes circuits that, on the basis of the signals RESET, EQL, and SAVE supplied from the control section 9, generates signals RESETB, EQLB, and SAVEB which are respective inversion signals of the signals.

The inverter 21 inverts the clock signal CLK to thereby generate a clock signal CB. The inverter 22 inverts the clock signal CB to thereby generate a clock signal C.

(Master Latch 30)

The master latch 30 includes an inverter 31, a transmission gate 32, inverters 33 and 34, and a transmission gate 35.

The inverter 31 includes an input terminal coupled to the data input terminal D of the flip-flop 20 and an output terminal coupled to one end of the transmission gate 32. The one end of the transmission gate 32 is coupled to the output terminal of the inverter 31, and another end thereof is coupled to a node N31. The transmission gate 32 brings a part between the one end and the other end into an on state when the clock signal C is "0" (low level), and brings the part between the one end and the other end into an off state when the clock signal C is "1" (high level).

The inverter 33 includes an input terminal coupled to the node N31 and an output terminal coupled to a node N32.

The inverter 34 includes an input terminal coupled to the node N32 and an output terminal coupled to one end of the transmission gate 35. The one end of the transmission gate 35 is coupled to the output terminal of the inverter 34, and another end thereof is coupled to the node N31. The transmission gate 35 brings a part between the one end and the other end into an on state when the clock signal C is "1", and brings the part between the one end and the other end into an off state when the clock signal C is "0".

(Slave Latch 40)

The slave latch 40 includes a transmission gate 41, an inverted AND (NAND) circuit 42, a transistor 43, an inverter 44, a transistor 45, a transmission gate 46, a transistor 47, a transistor 48, and an inverter 49.

One end of the transmission gate 41 is coupled to the node N32, and another end thereof is coupled to a node N41. The transmission gate 41 brings a part between the one end and the other end into an on state when the clock signal C is "1", and brings the part between the one end and the other end into an off state when the clock signal C is "0". A voltage at the node N41 is hereinafter referred to as a signal SLAVE.

The inverted AND circuit 42 includes a first input terminal supplied with the signal RESETB, a second input terminal coupled to the node N41, an output terminal coupled to a node N42, and a grounding terminal coupled to a drain of the transistor 43. The transistor 43 is an N-type MOS transistor, and includes a gate supplied with the signal EQLB, a drain coupled to the grounding terminal of the inverted AND circuit 42, and a source coupled to the grounding terminal T2 of the circuit 10. With this configuration, the inverted AND circuit 42 outputs an inverted logical product of the signal RESETB at the first input terminal and the signal SLAVE at the second input terminal when the signal EQL is "0", and brings the output impedance into a high-impedance state when the signal EQL is "1". A voltage at the node N42 is hereinafter referred to as a signal SLAVEB.

The inverter 44 includes an input terminal coupled to the node N42, an output terminal coupled to one end of the transmission gate 46, and a grounding terminal coupled to a drain of the transistor 45. The transistor 45 is an N-type MOS transistor, and includes a gate supplied with the signal EQLB, a drain coupled to the grounding terminal of the inverter 44, and a source coupled to the grounding terminal T2 of the circuit 10. With this configuration, the inverter 44 outputs an inversion signal of the signal SLAVEB at the input terminal when the signal EQL is "0", and brings the output impedance into a high-impedance state when the signal EQL is "1".

The one end of the transmission gate 46 is coupled to the output terminal of the inverter 44, and another end thereof is coupled to the node N41. The transmission gate 46 brings a part between the one end and the other end into an on state when the clock signal C is "0", and brings the part between the one end and the other end into an off state when the clock signal C is "1". The transistor 47 is a P-type MOS transistor, and includes a gate supplied with the signal RESTORE, a source coupled to the output terminal of the inverter 44 and the one end of the transmission gate 46, and another end coupled to the node N41.

The transistor 48 is an N-type MOS transistor, and includes a gate supplied with the signal EQL, a source coupled to the node N42, and a drain coupled to the node N41.

The inverters 49 includes an input terminal coupled to the node N42 and an output terminal coupled to the data output terminal Q of the flip-flop 20.

(Balloon Circuit 50)

The balloon circuit 50 includes a transmission gate 51, an inverted OR (NOR) circuit 52, an inverter 53, and a transmission gate 54.

One end of the transmission gate 51 is coupled to the node N41, and another end thereof is coupled to a node N51. The transmission gate 51 brings a part between the one end and the other end into an on state when the signal SAVE is "1", and brings the part between the one end and the other end into an off state when the signal SAVE is "0". A voltage at the node N51 is hereinafter referred to as a signal BALOON.

The inverted OR circuit 52 includes a first input terminal supplied with the signal RESET, a second input terminal coupled to the node N51, and an output terminal coupled to the node N52. A voltage at the node N52 is hereinafter referred to as a signal BALOONB.

The inverter 53 includes an input terminal coupled to the node N52 and an output terminal coupled to one end of the transmission gate 54. The one end of the transmission gate 54 is coupled to the output terminal of the inverter 53, and another end thereof is coupled to the node N51. The transmission gate 54 brings a part between the one end and the other end into an on state when the signal SAVE is "0", and brings the part between the one end and the other end into an off state when the signal SAVE is "1".

(Storage Circuit 60)

The storage circuit 60 includes inverters 61 and 62, transistors 63 to 66, and storage element 67 and 68.

The inverter 61 includes an input terminal coupled to the node N51 of the balloon circuit 50 and an output terminal coupled to a drain of the transistor 63. The inverter 62 includes an input terminal coupled to the node N52 of the balloon circuit 50 and an output terminal coupled to a drain of the transistor 64.

The transistors 63 and 64 are each an N-type MOS transistor. The transistor 63 includes a gate supplied with a signal SR, a drain coupled to the output terminal of the inverter 61, and a source coupled to a node N61. The transistor 64 includes a gate supplied with the signal SR, a drain coupled to the output terminal of the inverter 62, and a source coupled to a node N62. The transistors 63 and 64 are each brought into an on state in a case of writing information into the storage elements 67 and 68, respectively, as described later.

The transistors 65 and 66 are each a P-type MOS transistor. The transistor 65 includes a gate supplied with the signal RESTORE, a source coupled to the node N41, and a drain coupled to the node N61. The transistor 66 includes a gate supplied with the signal RESTORE, a source coupled to the node N42, and a drain coupled to the node N62. The transistors 65 and 66 are each brought into an on state in a case of reading out information from the storage elements 67 and 68, respectively, as described later.

The storage elements 67 and 68 are each a non-volatile storage element, and in this example, is a spin-injection magnetization inversion type (STT; Spin Transfer Torque) magnetic tunnel junction (MTJ; Magnetic Tunnel Junction) element that stores information by changing an orientation of magnetization of a free layer F (described later) by spin injection. One end of the storage element 67 is coupled to the node N61, and another end thereof is supplied with the signal CTRL. One end of the storage element 68 is coupled to the node N62, and another end thereof is supplied with the signal CTRL.

Hereinafter, description is given exemplifying the storage element 67. It is to be noted that the same holds true also for the storage element 68. The storage element 67 includes the free layer F, a tunnel barrier layer T, and a pinned layer P. The free layer F is configured by a ferromagnetic material whose magnetization orientation changes, for example, in a direction perpendicular to a film surface in accordance with an inflowing spin-polarized current. The pinned layer P is configured by a ferromagnetic material whose magnetization orientation is fixed in a direction perpendicular to the film surface, for example. The tunnel barrier layer T functions to cut magnetic coupling between the free layer F and the pinned layer P and to pass a tunnel current therethrough. In this example, the free layer F is coupled to the node N61, and the pinned layer P is supplied with the signal CTRL.

With this configuration, in the storage element 67, for example, in a case where a current is caused to flow from the free layer F to the pinned layer P, a resistance value between both ends of the storage element 67 becomes low (high-resistance state R H). The high-resistance state RH is a state corresponding to "1" (high level). Conversely, when a current is caused to flow from the pinned layer P to the free layer F, for example, the resistance value between the both ends of the storage element 67 becomes low (low-resistance state RL). The low-resistance state RL is a state corresponding to "0" (high level).

Thus, in the storage elements 67 and 68, the resistance state changes between the high-resistance state RH and the low-resistance state RL in accordance with a direction in which the current flows. Setting the resistance state in this manner enables the storage elements 67 and 68 to store information.

(Exclusive OR Circuit 23)

An exclusive OR circuit 23 includes a first input terminal coupled to the node N52 and a second input terminal coupled to the node N42. In addition, the exclusive OR circuit 23 outputs, as the signal CMP_OUT, an exclusive logical sum of the signal BALOONB at the first input terminal and the signal SLAVEB at the second input terminal. The exclusive OR circuit 23 operates as illustrated in FIG. 3.

(Mode Control Circuit 70)

The mode control circuit 70 generates the signal SR on the basis of the signals STORE, INITIALIZE, and VERIFY as well as the signal CMP_OUT.

FIG. 4 illustrates a configuration example of the mode control circuit 70. The exclusive OR circuit 23 illustrated in FIG. 2 is also depicted in FIG. 4 for convenience of description. The mode control circuit 70 includes an exclusive OR circuit 71, an OR (OR) circuit 72, and an AND circuit 73. FIG. 5A illustrates a truth table of the exclusive OR circuit 71 of the mode control circuit 70 with its operation; FIG. 5B illustrates a truth table of the OR circuit 72; and FIG. 5C illustrates a truth table of the AND circuit 73 with its operation.

The exclusive OR circuit 71 determines an exclusive logical sum of the signal CMP_OUT and the signal VERIFY, and outputs a result thereof as a signal CMP_OUT_V. The OR circuit 72 determines a logical sum of the signal STORE and the signal INITIALIZE, and outputs a result thereof as a signal WRITE. The AND circuit 73 determines a logical product of the signal CMP_OUT_V and the signal WRITE, and outputs a result thereof as the signal SR.

Here, the slave latch 40 corresponds to a specific example of a "first storage section" in the present disclosure. The balloon circuit 50 corresponds to a specific example of a "second storage section" in the present disclosure. The storage circuit 60 corresponds to a specific example of a "third storage section" in the present disclosure. The exclusive OR circuit 23, the mode control circuit 70, the determination circuit 11, the CPU 7, and the control section 9 each correspond to a specific example of a "control section" in the present disclosure. The signal SAVE corresponds to a specific example of a "first control signal" in the present disclosure. The signal SR and the signal CTRL each correspond to a specific example of a "second control signal" in the present disclosure. The signal CTRL corresponds to a specific example of a "drive signal" in the present disclosure. The signal RESTORE corresponds to a specific example of a "third control signal" in the present disclosure.

[Operations and Workings]

Next, description is given of operations and workings of the semiconductor circuit 1 of the present embodiment.

(Overview of Overall Operations)

First, description is given of an overview of overall operations of the semiconductor circuit 1 with reference to FIGS. 1 and 2. The CPU 7 instructs an operation mode of the semiconductor circuit 1 by supplying a control signal to the control section 9. The control section 9 supplies the control signal SIG (the eight signals STORE, RESTORE, INITIALIZE, RESET, VERIFY, EQL, SAVE, and CTRL) to each flip-flop 20 of the circuit 10 on the basis of an operation mode instructed by the CPU 7. In the active mode M1, the flip-flop 20 of the circuit 10 samples a signal inputted to the data input terminal D on the basis of a rising edge of the clock signal CLK, and outputs a sampling result thereof out of the data output terminal Q.

In a case of shifting the operation mode from the active mode M1 to the sleep mode M2, the CPU 7 first instructs that the semiconductor circuit 1 should operate in the store mode M3, and thereafter instructs that the semiconductor circuit 1 should operate in the verify mode M4. In the verify mode M4, on the basis of the signals CMP_OUT supplied from the plurality of flip-flops 20, the determination circuit 11 determines whether or not the information stored in the slave latch 40 has been able to be written normally into the storage circuit 60 in all the flip-flops 20. In a case where it is recognized that some flip-flop 20 of the plurality of flip-flops 20 has not been able to write the information normally into the storage circuit 60 on the basis of a result of the determination in the determination circuit 11, the CPU 7 instructs that the semiconductor circuit 1 should operate in the retry mode M5. Consequently, the flip-flop 20 which has not been able to write the information normally into the storage circuit 60 repeats the writing of the information into the storage circuit 60 while changing the writing condition. Then, in a case where all the flip-flops 20 have written the information normally into the storage circuit 60, the CPU 7 brings the power transistor 8 into an off state.

On the other hand, in a case of shifting the operation mode from the sleep mode M2 to the active mode M1, the CPU 7 first instructs that the semiconductor circuit 1 should operate in the restore mode M6, and next brings the power transistor 8 into an on state.

(Detailed Operation)

Next, description is given in detail of operations of the semiconductor circuit 1 exemplifying a series of operations thereof in which the operation mode shifts from the sleep mode M2 to the active mode M1 and returns to the sleep mode M2.

FIGS. 6A, 6B, 6C, 6D, 6E, 6F, 6G, 6H, 6I, and 6J each illustrate an operation example of the slave latch 40, the balloon circuit 50, and the storage circuit 60 in the flip-flop 20. FIGS. 6A, 6B, 6C, 6D, 6E, 6F, 6G, 6H, 6I, and 6J each illustrate the transmission gates 41 and 46 in the slave latch 40 and the transmission gates 51 and 54 in the balloon circuit 50 appropriately using switches representing operation statuses of the transmission gates. Likewise, the transistors 43, 45, 47, and 48 in the slave latch 40 and the transistors 63 to 66 of the storage circuit 60 are illustrated appropriately using switches representing operation statuses of the transistors.

(Case of Shifting from Sleep Mode M2 to Active Mode M1)

In a case of shifting the operation mode from the sleep mode M2 to the active mode M1, the CPU 7 first instructs that the semiconductor circuit 1 should operate in the restore mode M6. At this time, the power transistor 8 is in an off state. The control section 9 sets the signal RESTORE to "0" (active) on the basis of an instruction from the CPU 7. Consequently, the transistors 47, 65, and 66 are brought into an on state, thus causing the node N41 of the slave latch 40 to be coupled to the storage element 67 via the transistor 65, and causing the node N42 of the slave latch 40 to be coupled to the storage element 68 via the transistor 66. Next, the CPU 7 brings the power transistor 8 into an on state. At this time, as illustrated in FIG. 6A, the signal CTRL is "0", the signal RESET is "0" (non-active), the transmission gate 41 is in an off state, and the transmission gate 46 is in an on state. In addition, the signal EQL is "0" (non-active), and thus the transistors 43 and 45 are each in an on state and the transistor 48 is in an off state. Accordingly, in the slave latch 40, a negative feedback operation is performed, the inverted AND circuit 42 tries to output an inversion signal of the signal SLAVE at the node N41 to the node N42, and the inverter 44 tries to output an inversion signal of the signal SLAVEB at the node N42 to the node N41. In this example, a resistance state of the storage element 67 is the high-resistance state RH ("1"), and a resistance state of the storage element 68 is the low-resistance state RL ("0"). Accordingly, the node N41 is pulled down at a high resistance value, and the node N42 is pulled down at a low resistance value; thus, the signal SLAVE at the node N41 becomes "1", and the signal SLAVEB at the node N42 becomes "0". That is, the signal SLAVE becomes "1" in accordance with the high-resistance state RH ("1"), and the signal SLAVEB becomes "0" in accordance with the low-resistance state RL ("0"). In this manner, the flip-flop 20 reads out the information stored in the storage circuit 60 to the slave latch 40.

Next, the control section 9 sets the signal RESTORE to "1" (non-active). Consequently, as illustrated in FIG. 6B, the transistors 47, 65, and 66 are each brought into an off state, thus causing the node N41 of the slave latch 40 to be decoupled from the storage element 67, and causing the node N42 to be decoupled from the storage element 68. In addition, the control section 9 sets the signal SAVE to "1" (active). This brings the transmission gate 51 into an on state and the transmission gate 54 into an off state, thus causing the node N41 of the slave latch 40 to be coupled to the node N51 of the balloon circuit 50 via the transmission gate 51. As a result, in this example, the signal BALOON of the node N51 becomes "1", and the signal BALOONB of the node N52 becomes "0".

Next, the control section 9 sets the signal SAVE to "0" (non-active). As illustrated in FIG. 6C, this brings the transmission gate 51 into an off state and the transmission gate 54 into an on state, thus causing the node N41 of the slave latch 40 to be decoupled from the balloon circuit 50. Then, the balloon circuit 50 performs a negative feedback operation and stores information. In this example, the signal BALOON is "1", and the signal BALOONB is "0". In this manner, the flip-flop 20 transfers the information stored in the slave latch 40 to the balloon circuit 50.

In this manner, the operation mode of the semiconductor circuit 1 shifts from the sleep mode M2 to the active mode M1 (FIG. 6D). For example, when the clock signal CLK starts toggling, the flip-flop 20 operates in response to the clock signals C and CB. For example, when the clock signal C is "1", the transmission gate 41 is brought into an on state, and the transmission gate 46 is brought into an off state. This causes the node N32 of the master latch 30 to be coupled to the node N41 of the slave latch 40. Then, when the clock signal C is "0", the transmission gate 41 is brought into an off state, and the transmission gate 46 is brought into an on state. This causes the slave latch 40 to perform a negative feedback operation and to store information. In this operation, as illustrated in FIG. 6D, the transmission gate 51 maintains the off state. This allows the information stored in the balloon circuit 50 to be maintained.

(Case of Shifting from Active Mode M1 to Sleep Mode M2)

In a case of shifting the operation mode from the active mode M1 to the sleep mode M2, the CPU 7 first instructs that the semiconductor circuit 1 should operate in the store mode M3. The control section 9 sets the signal STORE to "1" (active) on the basis of an instruction from the CPU 7. In addition, the control section 9 stops the clock signal CLK, and sets the clock signal CLK to "0". Thereafter, the flip-flop 20 performs different operations in accordance with the information stored in the slave latch 40.

In a case where the information (e.g., signal SLAVE) stored in the slave latch 40 is the same as the information (e.g., signal BALOON) stored in the balloon circuit 50, the signal CMP_OUT becomes "0" as illustrated in FIG. 6E. In this case, the mode control circuit 70 sets the signal SR to "0". That is, in the mode control circuit 70 (FIG. 4), the signal VERIFY is "0" (non-active) and the signal CMP_OUT is "0", and thus the signal CMP_OUTV becomes "0" and the signal SR becomes "0". Accordingly, the transistors 63 and 64 maintain the OFF state. As a result, the flip-flop 20 does not write information into the storage circuit 60. That is, in this case, as illustrated in FIG. 6E, the resistance state of the storage element 67 is the high-resistance state RH corresponding to the signal SLAVE ("1") at the node N41 of the slave latch 40, and the resistance state of the storage element 68 is the low-resistance state RL corresponding to the signal SLAVEB ("0") at the node N42. As described above, in the storage circuit 60, the resistance states of the storage elements 67 and 68 are already resistance states corresponding to the nodes N41 and N42 of the slave latch 40, and thus the flip-flop 20 does not write information into the storage circuit 60.

On the other hand, in a case where the information (e.g., signal SLAVE) stored in the slave latch 40 differs from the information (e.g., signal BALOON) stored in the balloon circuit 50, the signal CMP_OUT becomes "1" as illustrated in FIGS. 6F and 6G. In this case, the flip-flop 20 writes the information stored in the slave latch 40 into the storage circuit 60. Specifically, the flip-flop 20 writes the information stored in the slave latch 40 into the storage circuit 60 in order to set the resistance state of the storage element 67 to the low-resistance state RL corresponding to the signal SLAVE ("0") at the node N41, and to set the resistance state of the storage element 68 to the high-resistance state RH corresponding to the signal SLAVEB ("1") at the node N42.

First, as illustrated in FIGS. 6F and 6G, the mode control circuit 70 sets the signal SR to "1". That is, in the mode control circuit 70 (FIG. 4), the signal VERIFY is "0" (non-active) and the signal CMP_OUT is "1", and thus the signal CMP_OUTV becomes "1". In addition, the signal STORE is "1" (active) and the signal INITIALIZE is "0" (non-active), and thus the signal WRITE becomes "1". As a result, the signal SR becomes "1". Accordingly, as illustrated in FIGS. 6F and 6G, the transistors 63 and 64 are each brought into an on state. Then, the flip-flop 20 writes the information into the storage circuit 60 in two steps using the signal BALOON at the node N51 and the signal BALOONB at the node N52 of the balloon circuit 50.

In the first step, the control section 9 sets the signal CTRL to "1" as illustrated in FIG. 6F. This causes, in the storage circuit 60, a current to flow through one of the storage elements 67 and 68 in accordance with the information stored in the balloon circuit 50. In this example, the signal BALOON is "1", and the signal BALOONB is "0". Accordingly, a store current Istore1 flows in the order of the storage element 67, the transistor 63, and the inverter 61. At this time, in the storage element 67, the store current Istore1 flows from the pinned layer P to the free layer F, and thus the resistance state of the storage element 67 becomes the low-resistance state RL ("0").

Next, the control section 9 sets the signal CTRL to "0" in the second step, as illustrated in FIG. 6G. This causes, in the storage circuit 60, a current to flow through the other of the storage elements 67 and 68 in accordance with the information stored in the balloon circuit 50. In this example, a store current Istore2 flows in the order of the inverter 62, the transistor 64, and the storage element 68. At this time, in the storage element 67, the store current Istore2 flows from the free layer F to the pinned layer P, and thus the resistance state of the storage element 68 becomes the high-resistance state RH ("1").

Through these two steps, as illustrated in FIG. 6G, the resistance state of the storage element 67 becomes the low-resistance state RL corresponding to the signal SLAVE ("0") at the node N41, and the resistance state of the storage element 68 becomes the high-resistance state RH corresponding to the signal SLAVEB ("1") at the node N42.

It is assumed, in this example, that the flip-flop 20 has been able to write the information normally into the storage circuit 60; however, there may be a case where a certain flip-flop 20 of the plurality of flip-flops 20 is not able to write the information normally into the storage circuit 60. Therefore, the semiconductor circuit 1 next checks whether or not the information stored in the slave latch 40 is able to be written normally into the storage circuit 60 in all the flip-flops 20 (verify mode M4). Then, in a case where a certain flip-flop 20 of the plurality of flip-flops 20 is not able to write the information normally into the storage circuit 60, the flip-flop 20 repeats the writing of the information while changing the writing condition, for example, until the information is able to be written normally (retry mode M5).

First, the CPU 7 instructs that the semiconductor circuit 1 should operate in the verify mode M4. The control section 9 sets the signal STORE to "0" (non-active), and sets the signal VERIFY to "1" (active) on the basis of an instruction from the CPU 7. This causes the mode control circuit 70 to set the signal SR to "0". That is, in the mode control circuit 70 (FIG. 4), the signal STORE and the signal INITIALIZE are each "0" (non-active), and thus the signal WRITE becomes "0" and the signal SR becomes "0". Accordingly, as illustrated in FIG. 6H, the transistors 63 and 64 are each brought into an off state. In addition, the control section 9 sets the signal EQL to "1" (active) on the basis of an instruction from the CPU 7. As illustrated in FIG. 6H, this brings the transistors 43 and 45 into an off state and the transistor 48 into an on state. At this time, in the slave latch 40, the nodes N41 and N42 are coupled to each other and are brought into a floating state. That is, the slave latch 40 is charged to the power supply voltage VDD. It is to be noted that, by further setting the signal CTRL to "1" and bringing the transistors 65 and 66 into an on state, it is possible to charge the slave latch 40 to the power supply voltage VDD in a shorter period of time.

Next, the control section 9 sets the signal RESTORE to "0" (active). Consequently, the transistors 47, 65, and 66 are each brought into an on state, thus causing the node N41 of the slave latch 40 to be coupled to the storage element 67 via the transistor 65 and the node N42 of the slave latch 40 to be coupled to the storage element 68 via the transistor 66. Next, the control section 9 sets the signal EQL to "0" (non-active). As described below, this causes the flip-flop 20 to read out the information stored in the storage circuit 60 to the slave latch 40 similarly to the operation in the restore mode M6 described above (FIG. 6A).

For example, in the flip-flop 20 in which the information is written normally into the storage circuit 60 by the operation in the above-described store mode M3 (FIGS. 6F and 6G), the resistance state of the storage element 67 is the low-resistance state RL ("0") and the resistance state of the storage element 68 is the high-resistance state RH ("1") as illustrated in FIG. 6I. Accordingly, the node N41 is pulled down at a low resistance value and the node N42 is pulled down at a high resistance value, and thus the signal SLAVE at the node N41 becomes "0" and the signal SLAVEB at the node N42 becomes "1". In this case, the information (e.g., signal SLAVE) stored in the slave latch 40 differs from the information (e.g., signal BALOON) stored in the balloon circuit 50, and thus the signal CMP_OUT becomes "1".

Meanwhile, in the flip-flop 20 in which the information is not written normally into the storage circuit 60 by the operation in the above-described store mode M3 (FIGS. 6F and 6G), as illustrated in FIG. 6J, the resistance state of the storage element 67 is the high-resistance state RH ("1") and the resistance state of the storage element 68 is the low-resistance state RL ("0") in this example. Accordingly, the node N41 is pulled down at a high resistance value and the node N42 is pulled down at a low resistance value, and thus the signal SLAVE at the node N41 becomes "1" and the signal SLAVEB at the node N42 becomes "0". In this example, the information (e.g., signal SLAVE) stored in the slave latch 40 becomes the same as the information (e.g., signal BALOON) stored in the balloon circuit 50, and thus the signal CMP_OUT becomes "0".

Then, the control section 9 sets the signal RESTORE to "1" (non-active). This brings, in the flip-flop 20, the transistors 47, 65, and 66 into an off state, thus causing the node N41 of the slave latch 40 to be decoupled from the storage element 67 and the node N42 to be decoupled from the storage element 68.

In the verify mode M4, on the basis of the signals CMP_OUT supplied from the plurality of flip-flops 20, the determination circuit 11 determines whether or not the information stored in the slave latch 40 has been able to be written normally into the storage circuit 60 in all the flip-flops 20. Specifically, in a case where the signals CMP_OUT supplied from all the flip-flops 20 are each "1", the determination circuit 11 determines that the information has been able to be written normally into the storage circuit 60 in all the flip-flops 20.

In a case where the determination circuit 11 determines that the information stored in each slave latch 40 of all the flip-flops 20 has been able to be written normally into the storage circuit 60, the CPU 7 brings the power transistor 8 into an off state. This causes the semiconductor circuit 1 to shift the operation mode to the sleep mode M2.

In addition, in a case where the CPU 7 determines, for example, that the determination circuit 11 is not able to normally write the information stored in the slave latch 40 of some flip-flop 20 into the storage circuit 60, the CPU 7 instructs that the flip-flop 20 should operate in the retry mode M5. The control section 9 sets the signal STORE to "1" (active) on the basis of an instruction from the CPU 7.

In the flip-flop 20 (FIG. 6I) in which the information is written normally into the storage circuit 60 in the operation in the store mode M3 (FIGS. 6F and 6G), the mode control circuit 70 sets the signal SR to "0". That is, in the mode control circuit 70 (FIG. 4), the signal VERIFY is "1" (active) and the signal CMP_OUT is "1", and thus the signal CMP_OUT_V becomes "0" and the signal SR becomes "0". Accordingly, the transistors 63 and 64 maintain the OFF state. As a result, the flip-flop 20 does not write the information into the storage circuit 60. That is, the information is written normally into the storage circuit 60 in this case, and thus the flip-flop 20 does not perform the writing again.

Meanwhile, in the flip-flop 20 (FIG. 6J) in which the information has not been written normally into the storage circuit 60 in the operation in the store mode M3 (FIGS. 6F and 6G), the mode control circuit 70 sets the signal SR to "1". That is, in the mode control circuit 70 (FIG. 4), the signal VERIFY is "1" (active) and the signal CMP_OUT is "0", and thus the signal CMP_OUT_V becomes "1". In addition, the signal STORE is "1" (active) and the signal INITIALIZE is "0" (non-active), and thus the signal WRITE becomes "1". Accordingly, the signal SR becomes "1". This brings the transistors 63 and 64 into an on state. Then, the flip-flop 20 writes the information into the storage circuit 60 in two steps using the signal BALOON at the node N51 and the signal BALOONB at the node N52 of the balloon circuit 50 similarly to the operation in the store mode M3 (FIGS. 6F and 6G). Specifically, the control section 9 sets the signal CTRL to "1" in the first step and sets the signal CTRL to "0" in the second step, similarly to the operation in the store mode M3. At that time, for example, the control section 9 changes the writing condition to enable the information to be written normally into the storage circuit 60. Specifically, the control section 9 changes, for example, a voltage and a pulse width of the signal CTRL. Then, the flip-flop 20 reads out the information stored in the storage circuit 60 to the slave latch 40 similarly to the operations illustrated in FIGS. 6H, 6I, and 6J. Then, the determination circuit 11 determines whether or not the information stored in the slave latch 40 has been able to be written normally into the storage circuit 60 on the basis of the signal CMP_OUT outputted by the flip-flop 20. In this manner, the semiconductor circuit 1 repeats the writing of the information while changing the writing condition until the information is able to be written normally into the storage circuit 60.

FIGS. 7A and 7B each illustrate an example of a waveform of the signal CTRL in a case where the voltage of the signal CTRL is changed. In the example of FIG. 7A, the voltage of the signal CTRL at the time of setting the signal CTRL to "1" is gradually increased each time the writing of the information is repeated. Further, in the example of FIG. 7B, the voltage of the signal CTRL at the time of setting the signal CTRL to "0" is also gradually lowered each time the writing of the information is repeated.

FIGS. 8A and 8B each illustrate an example of the waveform of the signal CTRL in a case where the pulse width of the signal CTRL is changed. In the example of FIG. 8A, the pulse width of the signal CTRL at the time of setting the signal CTRL to "1" is gradually increased each time the writing of the information is repeated. Further, in the example of FIG. 8B, the pulse width of the signal CTRL at the time of setting the signal CTRL to "0" is also increased each time the writing of the information is repeated.

FIG. 9 illustrates an example of the waveform of the signal CTRL in a case where the voltage and the pulse width of the signal CTRL are changed. In this example, the voltage of the signal CTRL at the time of setting the signal CTRL to "1" is gradually increased each time the writing of the information is repeated, and the pulse width of the signal CTRL at the time of setting the signal CTRL to "1" is gradually increased each time the writing of the information is repeated.

In this manner, the control section 9 changes the writing condition, and the flip-flop 20 repeats the writing of the information until the information is able to be written normally into the storage circuit 60. The semiconductor circuit 1 repeats the writing of the information while changing the writing condition until all the flip-flops 20 are able to normally write the information.

Then, in a case where the determination circuit 11 determines that the information stored in each slave latch 40 of all the flip-flops 20 has been able to be written normally into the storage circuit 60, the CPU 7 brings the power transistor 8 into an off state. This causes the semiconductor circuit 1 to shift the operation mode to the sleep mode M2.

FIGS. 10A and 10B are flowcharts illustrating other operation examples of the semiconductor circuit 1. In this case, the semiconductor circuit 1 first initializes the storage circuit 60 of the flip-flop 20 (initialize mode M8), and resets the slave latch 40 and the balloon circuit 50 (reset mode M7). Then, the semiconductor circuit 1 operates in the active mode M1. Thereafter, the semiconductor circuit 1 shifts the operation mode from the active mode M1 to the sleep mode M2. At that time, the semiconductor circuit 1 first writes the information stored in the slave latch 40 of the flip-flop 20 into the storage circuit 60 (store mode M3), verifies whether or not the information has been able to be written normally into the storage circuit 60 (verify mode M4), and in a case where the information has not been able to be written normally into the storage circuit 60, changes the writing condition (retry mode M5), and performs the writing of the information again. Then, in a case where the information has been able to be written normally into the storage circuit 60, the semiconductor circuit 1 shifts the operation mode to the sleep mode M2. Thereafter, the semiconductor circuit 1 shifts the operation mode from the sleep mode M2 to the active mode M1. At that time, the semiconductor circuit 1 reads out the information from the storage circuit 60 to the slave latch 40 (restore mode M6). Hereinafter, description is given in detail of this operation.

(Initialize Mode M8)

First, the control section 9 sets the signal RESET to "1" (active) (step S101). This causes the semiconductor circuit 1 to initialize the information stored in the slave latch 40 and the information stored in the balloon circuit 50 of the flip-flop 20. Consequently, the signal SLAVE becomes "0", and the signal SLAVEB becomes "1". In addition, the signal BALOON becomes "1", and the signal BALOONB becomes "0". As a result, the signal CMP_OUT becomes "1".

Next, the control section 9 sets the signal INITIALIZE to "1" (active), and the mode control circuit 70 sets the signal SR to "1" (step S102). That is, in the mode control circuit 70 (FIG. 4), the signal VERIFY is "0" (non-active) and the signal CMP_OUT is "1", and thus the signal CMP_OUT_V becomes "1". In addition, the signal STORE is "0" (non-active) and the signal INITIALIZE is "1" (active), and thus the signal WRITE becomes "1". Accordingly, the signal SR becomes "1". This causes the flip-flop 20 to write the information into the storage circuit 60.

Next, the control section 9 sets the signal SAVE to "0" (non-active), sets the signal EQL to "1" (active), and sets the signal VERIFY to "1" (active) (step S103). This causes the flip-flop 20 to couple the nodes N41 and N42 of the slave latch 40 to each other and to bring them into a floating state.

Next, the control section 9 sets the signal EQL to "0" (non-active), and sets the signal RESTORE to "0" (active) (step S104). This causes the flip-flop 20 to read out the information stored in the storage circuit 60 to the slave latch 40. Then, the exclusive OR circuit 23 compares the information stored in the slave latch 40 and the information stored in the balloon circuit 50 with each other to thereby generate the signal CMP_OUT. In a case where the information has been able to be written normally into the storage circuit 60 in step S102, the signal SLAVE at the node N41 becomes "0", and the signal SLAVEB at the node N42 becomes "1". At this time, the signal BALOONB is "0", and thus the signal CMP_OUT becomes "1". On the other hand, in a case where the information has not been able to be written normally, for example, the signal SLAVE at the node N41 is "1", and the signal SLAVEB at the node N42 is "0". At this time, the signal CMP_OUT becomes "0".

(Retry Mode M5)

In a case where the signal CMP_OUT is "0" ("N" in step S105), the control section 9 changes the writing condition (step S106). That is, in this case, the information has not been able to be written normally into the storage circuit 60 in step S102, and thus the control section 9 changes the writing condition. Specifically, the control section 9 changes the voltage and the pulse width of the signal CTRL, for example, as illustrated in FIGS. 7A, 7B, 8A, 8B and 9. Then, the flow returns to step S102. Then, the semiconductor circuit 1 repeats the operation of steps S102 to S106 until the signal CMP_OUT becomes "1".

(Reset Mode M7)

In a case where, in step S105, the signal CMP_OUT is "1" ("Y" in step S105), the control section 9 sets the signal INITIALIZE to "0" (non-active), sets the signal VERIFY to "0" (non-active), and sets the signal RESET to "1" (active) (step S111). This causes the semiconductor circuit 1 to initialize the information stored in the slave latch 40 and the information stored in the balloon circuit 50 of the flip-flop 20. Consequently, the signal SLAVE becomes "0", and the signal SLAVEB becomes "1". In addition, the signal BALOON becomes "1", and the signal BALOONB becomes "0".

(Active Mode M1)

Next, the control section 9 sets the signal RESET to "0" (non-active) (step S121). This causes the flip-flop 20 to perform a normal operation.

Then, after having performed the operation in the active mode M1 for a while, the semiconductor circuit 1 shifts the operation mode from the active mode M1 to the sleep mode M2. Specifically, as described below, the semiconductor circuit 1 shifts the operation mode to the sleep mode M2 through the store mode M3 and the verify mode M4.

(Store Mode M3)

First, the control section 9 sets the signal STORE to "1" (active), stops the clock signal CLK, and sets the clock signal CLK to "0" (step S131). The exclusive OR circuit 23 compares the information stored in the slave latch 40 and the information stored in the balloon circuit 50 with each other to thereby generate the signal CMP_OUT.

In a case where the signal CMP_OUT is "0" ("Y" in step S132), the flow proceeds to step S141. That is, in this case, the resistance states of the storage elements 67 and 68 are already resistance states corresponding to the nodes N41 and N42 of the slave latch 40, and thus the flip-flop 20 does not write the information into the storage circuit 60. This operation corresponds to FIG. 6E.

In a case where the signal CMP_OUT is "1" ("N" in step S132), the mode control circuit 70 sets the signal SR to "1" (step S133). That is, in the mode control circuit 70 (FIG. 4), the signal VERIFY is "0" (non-active) and the signal CMP_OUT is "1", and thus the signal CMP_OUT_V becomes "1". In addition, the signal STORE is "1" (active) and the signal INITIALIZE is "0" (non-active), and thus the signal WRITE becomes "1". Accordingly, the signal SR becomes "1". This causes the flip-flop 20 to write the information into the storage circuit 60. This operation corresponds to FIGS. 6F and 6G.

(Verification Mode M4)

Next, the control section 9 sets the signal SAVE to "0" (non-active), sets the signal EQL to "1" (active), and sets the signal VERIFY to "1" (active) (step S134). This causes the flip-flop 20 to couple the nodes N41 and N42 of the slave latch 40 to each other and to bring them into a floating state. This operation corresponds to FIG. 6H.

Next, the control section 9 sets the signal EQL to "0" (non-active), and sets the signal RESTORE to "0" (active) (step S135). This causes the flip-flop 20 to read out the information stored in the storage circuit 60 to the slave latch 40. In a case where the information has been able to be written normally into the storage circuit 60 in step S133, the signal CMP_OUT becomes "1". This operation corresponds to FIG. 6I. On the other hand, in a case where the information has not been able to be written normally, the signal CMP_OUT becomes "0". This operation corresponds to FIG. 6J.

(Retry Mode M5)

In a case where the signal CMP_OUT is "0" ("N" in step S136), the control section 9 changes the writing condition (step S137). Specifically, the control section 9 changes the voltage and the pulse width of the signal CTRL, for example, as illustrated in FIGS. 7A, 7B, 8A, 8B and 9. Then, the flow returns to step S133. Then, the semiconductor circuit 1 repeats the operations of steps S102 to S106 until the signal CMP_OUT becomes "1".

(Sleep Mode M2)

Next, the control section 9 sets the signal STORE and the signal VERIFY to "0" (non-active), and the mode control circuit 70 sets the signal SR to "0" (step S141). That is, in the mode control circuit 70 (FIG. 4), the signal STORE is "0" (non-active) and the signal INITIALIZE is "0" (non-active), and thus the signal WRITE becomes "0" and the signal SR becomes "0". Then, the CPU 7 brings the power transistor 8 into an off state. In this manner, the semiconductor circuit 1 brings the circuit 10 into a sleep state.

After a while, the semiconductor circuit 1 shifts the operation mode from the sleep mode M2 to the active mode M1. Specifically, the semiconductor circuit 1 shifts the operation mode to the active mode M1 through the restore mode M6.

(Restore Mode M6)

First, the control section 9 sets the signal RESTORE to "0" (active) (step S151). Then, the CPU 7 brings the power transistor 8 into an on state. This causes the flip-flop 20 to read out the information stored in the storage circuit 60 to the slave latch 40.

Then, the control section 9 sets the signal SAVE to "1" (active) (step S152). This causes the flip-flop 20 to transfer the information stored in the slave latch 40 to the balloon circuit 50. Then, the flow returns to step S121.

In this manner, the operation mode is shifted to the active mode M1.

As described above, in the semiconductor circuit 1, the balloon circuit 50 is provided in each of the plurality of flip-flops 20. In addition, in the store mode M3, the information is written into the storage circuit 60 on the basis of the result of comparison between the information stored in the slave latch 40 and the information stored in the balloon circuit 50. Specifically, in the store mode M3, in a case where the information stored in the slave latch 40 and the information stored in the balloon circuit 50 differ from each other ("N" in step S132) in the semiconductor circuit 1, the information is written into the storage circuit 60 as illustrated in FIGS. 6F and 6G. This makes it possible, in the semiconductor circuit 1, to write information only in the flip-flop 20, which needs to write the information into the storage circuit 60, out of the plurality of flip-flops 20, thus making it possible to reduce the power consumption.

In addition, in the verify mode M4 and the retry mode M5, information is rewritten into the storage circuit 60 in the semiconductor circuit 1 on the basis of the result of the comparison between the information stored in the slave latch 40 and the information stored in the balloon circuit 50. Specifically, in the verify mode M4 and the retry mode M5, as illustrated in FIG. 6J, in a case where the information stored in the slave latch 40 and the information stored in the balloon circuit 50 are the same as each other ("N" in step S136), the information is rewritten into the storage circuit 60 in the semiconductor circuit 1. This makes it possible, in the semiconductor circuit 1, to write information only in the flip-flop 20, which has not been able to write the information normally into the storage circuit 60 in the writing operation immediately before, thus making it possible to reduce the power consumption.

In addition, in the verify mode M4 and the retry mode M5, the information is repeatedly written into the storage circuit 60 in the semiconductor circuit 1. This enables the semiconductor circuit 1 to reduce an error rate in writing.

In addition, in the verify mode M4 and the retry mode M5, the writing condition is changed in the semiconductor circuit 1 when the information is repeatedly written into the storage circuit 60, thus making it possible to appropriately set writing time in accordance with an electronic apparatus to be mounted with the semiconductor circuit 1, for example.

[Effects]

As described above, in the present embodiment, a balloon circuit is provided in each of the plurality of flip-flops, and the information is written into the storage circuit in the store mode on the basis of the result of comparison between the information stored in the slave latch and the information stored in the balloon circuit, thus making it possible to reduce the power consumption.

In the present embodiment, the information is rewritten into the storage circuit in the verify mode and the retry mode on the basis of the result of the comparison between the information stored in the slave latch and the information stored in the balloon circuit, thus making it possible to reduce the power consumption.

In the present embodiment, the information is repeatedly written into the storage circuit in the verify mode and the retry mode, thus making it possible to reduce the error rate in writing.

In the present embodiment, the writing condition is changed when the information is repeatedly written into the storage circuit in the verify mode and the retry mode, thus making it possible to appropriately set the writing time.

Modification Example 1

In the foregoing embodiment, the power transistor 8 is configured using the N-type MOS transistor, but this is not limitative; alternatively, for example, the P-type MOS transistor may be used to configure the power transistor. Hereinafter, description is given in detail of a semiconductor circuit 1A according to the present modification example.

FIG. 11 illustrates a configuration example of the semiconductor circuit 1A. The semiconductor circuit 1A includes a circuit 10A, a power transistor 8A, a CPU 7A and a control section 9A.

The circuit 10A is a circuit that performs a predetermined operation. The circuit 10 includes a power supply terminal T1 supplied with the power supply voltage VDD via the power transistor 8A and a grounding terminal T2 supplied with the ground voltage VGND. This causes the power supply voltage VDD to be supplied to the power supply terminal of each circuit in the circuit 10 when the power transistor 8A is in an on state. The circuit 10A includes a plurality of flip-flops 20A.

The power transistor 8A is turned on and off on the basis of a power control signal SPGB, and is a P-type MOS transistor in this example. The power control signal SPGB corresponds to an inversion signal of the power control signal SPG according to the foregoing embodiment. The power transistor 8A includes a gate supplied with the power control signal SPGB, a source supplied with the power supply voltage VDD, and a drain coupled to the power supply terminal T1 of the circuit 10A.

The CPU 7A controls operations of the semiconductor circuit 1A. In addition, the CPU 7A also has a function of performing so-called power gating by supplying the power control signal SPGB to the power transistor 8A and turning on and off the power transistor 8A.

The control section 9A supplies the control signal SIG to each flip-flop 20A of the circuit 10A on the basis of an operation mode instructed by the CPU 7A. The control signal SIG includes eight signals STORE, RESTOREB, INITIALIZE, RESET, VERIFY, EQL, SAVE, and CTRL. The signal RESTOREB corresponds to an inversion signal of the signal RESTORE according to the foregoing embodiment.

FIG. 12 illustrates a configuration example of the flip-flop 20A. The flip-flop 20A includes a slave latch 40A, a storage circuit 60A, and a mode control circuit 70A.

The slave latch 40A includes an inverted AND circuit 42A, a transistor 43A, an inverter 44A, a transistor 45A, and a transistor 47A.

The inverted AND circuit 42A includes a first input terminal supplied with the signal RESETB, a second input terminal coupled to the node N41, an output terminal coupled to the node N42, and a power supply terminal coupled to a drain of the transistor 43A. The transistor 43A is a P-type MOS transistor, and includes a gate supplied with the signal EQL, a source coupled to the power supply terminal T1 of the circuit 10A, and the drain coupled to the power supply terminal of the inverted AND circuit 42A.

The inverter 44A includes an input terminal coupled to the node N42, an output terminal coupled to one end of the transmission gate 46, and a power supply terminal coupled to a drain of the transistor 45A. The transistor 45A is a P-type MOS transistor, and includes a gate supplied with the signal EQL, a source coupled to the power supply terminal T1 of the circuit 10A, and the drain coupled to the power supply terminal of the inverter 44A.

The transistor 47A is an N-type MOS transistor, and includes a gate supplied with the signal RESTOREB, a source coupled to the output terminal of the inverter 44A and one end of the transmission gate 46, and another end coupled to the node N41.

The storage circuit 60A includes the inverters 61 and 62, transistors 63A to 66A, and storage elements 67A and 68A.

The inverter 61 includes an input terminal coupled to the node N51 of the balloon circuit 50 and an output terminal coupled to a source of the transistor 63A. The inverter 62 includes an input terminal coupled to the node N52 of the balloon circuit 50 and an output terminal coupled to a source of the transistor 64A.

The transistors 63A and 64A are each a P-type MOS transistors. The transistor 63A includes a gate supplied with a signal SRB, the source coupled to the output terminal of the inverter 61A, and a drain coupled to the node N61. The transistor 64A includes a gate supplied with the signal SRB, the source coupled to the output terminal of the inverter 62, and a drain coupled to the node N62. The signal SRB corresponds to an inversion signal of the signal SR according to the foregoing embodiment.

Transistors 65A and 66A are each an N-type MOS transistors. The transistor 65A includes a gate supplied with the signal RESTOREB, a drain coupled to the node N41, and a source coupled to the node N61. The transistor 66A includes a gate supplied with the signal RESTOREB, a drain coupled to the node N42, and a source coupled to the node N62.

The storage elements 67A and 68A are each a spin-injection magnetization inversion type magnetic tunnel junction element, similarly to the storage elements 67 and 68 according to the foregoing embodiment. In this example, the storage element 67A includes the pinned layer P coupled to the node N61 and the free layer F supplied with the signal CTRL. Likewise, the storage element 68A includes the pinned layer P coupled to the node N62 and the free layer F supplied with the signal CTRL.

FIG. 13 illustrates a configuration example of the mode control circuit 70A. The mode control circuit 70A includes an inverted AND circuit 73A. The inverted AND circuit 73A determines a logical product of the signal CMP_OUT_V and the signal WRITE, and outputs a result thereof as the signal SRB. [Modification Example 2]

In the foregoing embodiment, the flip-flop 20 is configured as illustrated in FIG. 2, but this is not limitative. For example, in the flip-flop 20, the node N51 is coupled to the drain of the transistor 63 via the inverter 61, and the node N52 is coupled to the transistor 64 via the inverter 62. However, alternatively, the inverters 61 and 62 may be removed to couple the node N51 to the drain of the transistor 64 and to couple the node N52 to the drain of the transistor 63. In addition, for example, the transistor 48 is provided in the flip-flop 20; however, alternatively, the transistor 48 may be removed. In addition, in the flip-flop 20, the balloon circuit 50 is able to be reset using the inverted OR circuit 52, but this is not limitative; another circuit may be used to reset the balloon circuit 50.

In the above example, the present modification example is applied to the flip-flop 20 according to the foregoing embodiment, but this is not limitative; the present modification example may be applied to the flip-flop 20A (FIG. 12) according to the modification example 1. FIG. 14 illustrates a configuration example of a flip-flop (flip-flop 20B) in which the present modification example is applied to the flip-flop 20A. The flip-flop 20B includes a slave latch 40B, a balloon circuit 50B, and a storage circuit 60B.

The slave latch 40B includes the transmission gate 41, the inverted AND circuit 42A, the transistor 43A, the inverter 44A, the transistor 45A, the transmission gate 46, the transistor 47A, and the inverter 49. That is, the slave latch 40B is obtained by omitting the transistor 48 from the slave latch 40A (FIG. 12).

The balloon circuit 50B includes the transmission gate 51, an inverter 55B, an inverted AND circuit 56B, and the transmission gate 54. The inverter 55B includes an input terminal coupled to the node N51 and an output terminal coupled to the node N52. The inverted AND circuit 56B includes a first input terminal supplied with the signal RESETB, a second input terminal coupled to the node N52, and an output terminal coupled to the one end of the transmission gate 54.

The storage circuit 60B includes the transistors 63A to 66A and the storage elements 67A and 68A. The transistor 63A includes the drain coupled to the node N52. The transistor 64A includes the drain coupled to the node N51.

Modification Example 3

In the foregoing embodiment, in a case where a certain flip-flop 20 has not been able to write information normally into the storage circuit 60, the flip-flop 20 repeats the writing of the information until the information is able to be written normally, but this is not limitative. For example, an upper limit may be set for the number of times of writing of information, and the writing of the information may be stopped, for example, in a case where the information is not able to be written normally even when the writing of the information is repeated up to the upper limit number of times.

Modification Example 4

In the foregoing embodiment, the storage elements 67 and 68 are configured using the magnetic tunnel junction element, but this is not limitative; various storage elements whose resistance states reversibly change may be used. Specifically, for example, a resistance-change type storage element, a phase-change type storage element, a ferroelectric storage element, and the like may be used as the storage element.

2. Application Examples

Next, description is given of an application example of the semiconductor circuit described in the foregoing embodiment and modification examples.

FIG. 15 illustrates an appearance of a smartphone to which the semiconductor circuit of the foregoing embodiments, etc. is applied. The smartphone includes, for example, a main body unit 310, a display unit 320, and a battery 330.

The semiconductor circuit according to the foregoing embodiments, etc. is applicable to electronic apparatuses in various fields such as a digital camera, a notebook personal computer, a portable gaming machine, a video camera, and the like, in addition to such a smart phone. In particular, the present technology is effective when being applied to a portable electronic apparatus having a battery.

Although the present technology has been described with reference to several embodiments and modification examples as well as specific examples of practical use thereof and application examples to electronic apparatuses, the present technology is not limited to these embodiments, etc., and various modifications are possible.

For example, in the foregoing embodiments, etc., the voltage and the pulse width of the signal CTRL are changed when the writing condition is changed, but this is not limitative. For example, the voltage of the signal SR may also be changed.

In addition, the present technology is applied to the slave latch 40 of the flip-flop 20, for example, in the foregoing embodiments, etc., but this is not limitative. For example, the present technology may be applied to the master latch 30. In addition, although the present technology is applied to the D-type flip-flop 20 in the foregoing embodiments, etc., this is not limitative; the present technology may be applied to another flip-flop such as a T-type flip-flop, for example. In addition, the present technology may be applied to a latch.

It is to be noted that the effects described herein are merely illustrative and not limiting, and may have other effects.

It is to be noted that the present technology may have the following configurations.

(1)

A semiconductor circuit including:

a volatile first storage section;

a volatile second storage section that stores data stored in the first storage section on the basis of a first control signal;

a non-volatile third storage section that stores data according to data stored in the second storage section on the basis of a second control signal, and causes the first storage section to store data stored in itself on the basis of a third control signal; and a control section that generates the first control signal and the third control signal, and compares the data stored in the first storage section and the data stored in the second storage section with each other to generate the second control signal on the basis of a result of the comparison.

(2)

The semiconductor circuit according to (1), in which the control section causes, during a first period, the first storage section to store the data stored in the third storage section using the third control signal, and causes the second storage section to store the data stored in the first storage section using the first control signal, and the control section causes, during a second period after the first period, the third storage section to store the data according to the data stored in the second storage section using the second control signal in a case where the result of the comparison indicates that the data stored in the first storage section and the data stored in the second storage section differ from each other.

(3)

The semiconductor circuit according to (2), in which the control section causes, during a third period after the second period, the first storage section to store the data stored in the third storage section using the third control signal, and the control section causes, during a fourth period after the third period, the third storage section to store the data according to the data stored in the second storage section using the second control signal in a case where the result of the comparison indicates that the data stored in the first storage section and the data stored in the second storage section coincide with each other.

(4)
The semiconductor circuit according to (3), in which the control section sets an operation condition in causing the third storage section to store the data according to the data stored in the second storage section during the fourth period, to a condition different from an operation condition in causing the third storage section to store the data according to the data stored in the second storage section during the second period.

(5)
The semiconductor circuit according to (4), in which
the third storage section includes a non-volatile storage element to which a drive signal is applied,
the second control signal includes the drive signal, and
the control section sets an amplitude of the drive signal to a first voltage during the second period, and sets the amplitude of the drive signal to a second voltage during the fourth period.

(6)
The semiconductor circuit according to (5), in which the second voltage is greater than the first voltage.

(7)
The semiconductor circuit according to any one of (4) to (6), in which
the third storage section includes the non-volatile storage element to which the drive signal is applied,
the second control signal includes the drive signal, and
the control section sets a pulse width of the drive signal to a first pulse width during the second period, and sets the pulse width of the drive signal to a second pulse width during the fourth period.

(8)
The semiconductor circuit according to (7), in which the second pulse width is wider than the first pulse width.

(9)
The semiconductor circuit according to any one of (3) to (8), in which the control section performs power supply control to stop power supply to the first storage section and the second storage section in a case where the result of the comparison indicates that the data stored in the first storage section and the data stored in the second storage section differ from each other during the fourth period.

(10)
The semiconductor circuit according to any one of (3) to (9), in which the control section repeats an operation during the third period and an operation during the fourth period until the result of the comparison indicates that the data stored in the first storage section and the data stored in the second storage section differ from each other.

(11)
The semiconductor circuit according to any one of (2) to (10), further including a first circuit and a second circuit, in which
in a fifth period between the first period and the second period, the first storage section stores data supplied from the first circuit, and supplies the stored data to the second circuit.

(12)
A method of controlling a semiconductor circuit, the method including:

comparing data stored in a volatile first storage section and data stored in a volatile second storage section that stores the data stored in the first storage section on the basis of a first control signal; and
supplying a second control signal to a non-volatile third storage section on the basis of a result of the comparison between the data stored in the first storage section and the data stored in the second storage section to thereby cause the third storage section to store data according to the data stored in the second storage section.

(13)
The method of controlling the semiconductor circuit according to (12), further including:
supplying, during a first period, a third control signal to the third storage section to thereby cause the first storage section to store the data stored in the third storage section, and causing the second storage section to store the data stored in the first storage section using the first control signal; and
causing, during a second period after the first period, the third storage section to store the data according to the data stored in the second storage section using the second control signal, in a case where the result of the comparison indicates that the data stored in the first storage section and the data stored in the second storage section differ from each other.

(14)
The method of controlling the semiconductor circuit according to (13), further including:
causing, during a third period after the second period, the first storage section to store the data stored in the third storage section using the third control signal; and
causing, during a fourth period after the third period, the third storage section to store the data according to the data stored in the second storage section using the second control signal, in a case where the result of the comparison indicates that the data stored in the first storage section and the data stored in the second storage section coincide with each other.

This application claims the benefit of Japanese Priority Patent Application JP2017-197486 filed with the Japan Patent Office on Oct. 11, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A semiconductor circuit comprising:
a volatile first storage section;
a volatile second storage section that stores data stored in the first storage section on a basis of a first control signal;
a non-volatile third storage section that stores data according to data stored in the second storage section on a basis of a second control signal, and causes the first storage section to store data stored in itself on a basis of a third control signal; and
a control section that generates the first control signal and the third control signal, and compares the data stored in the first storage section and the data stored in the second storage section with each other to generate the second control signal on a basis of a result of the comparison.

2. The semiconductor circuit according to claim 1, wherein
the control section causes, during a first period, the first storage section to store the data stored in the third storage section using the third control signal, and causes the second storage section to store the data stored in the first storage section using the first control signal, and the control section causes, during a second period after the first period, the third storage section to store the data according to the data stored in the second storage section using the second control signal in a case where the result of the comparison indicates that the data stored in the first storage section and the data stored in the second storage section differ from each other.

3. The semiconductor circuit according to claim 2, wherein
the control section causes, during a third period after the second period, the first storage section to store the data stored in the third storage section using the third control signal, and
the control section causes, during a fourth period after the third period, the third storage section to store the data according to the data stored in the second storage section using the second control signal in a case where the result of the comparison indicates that the data stored in the first storage section and the data stored in the second storage section coincide with each other.

4. The semiconductor circuit according to claim 3, wherein the control section sets an operation condition in causing the third storage section to store the data according to the data stored in the second storage section during the fourth period, to a condition different from an operation condition in causing the third storage section to store the data according to the data stored in the second storage section during the second period.

5. The semiconductor circuit according to claim 4, wherein
the third storage section includes a non-volatile storage element to which a drive signal is applied,
the second control signal includes the drive signal, and
the control section sets an amplitude of the drive signal to a first voltage during the second period, and sets the amplitude of the drive signal to a second voltage during the fourth period.

6. The semiconductor circuit according to claim 5, wherein the second voltage is greater than the first voltage.

7. The semiconductor circuit according to claim 4, wherein
the third storage section includes a non-volatile storage element to which a drive signal is applied,
the second control signal includes the drive signal, and
the control section sets a pulse width of the drive signal to a first pulse width during the second period, and sets the pulse width of the drive signal to a second pulse width during the fourth period.

8. The semiconductor circuit according to claim 7, wherein the second pulse width is wider than the first pulse width.

9. The semiconductor circuit according to claim 3, wherein the control section performs power supply control to stop power supply to the first storage section and the second storage section in a case where the result of the comparison indicates that the data stored in the first storage section and the data stored in the second storage section differ from each other during the fourth period.

10. The semiconductor circuit according to claim 3, wherein the control section repeats an operation during the third period and an operation during the fourth period until the result of the comparison indicates that the data stored in the first storage section and the data stored in the second storage section differ from each other.

11. The semiconductor circuit according to claim 2, further comprising a first circuit and a second circuit, wherein
in a fifth period between the first period and the second period, the first storage section stores data supplied from the first circuit, and supplies the stored data to the second circuit.

12. A method of controlling a semiconductor circuit, the method comprising:
comparing data stored in a volatile first storage section and data stored in a volatile second storage section that stores the data stored in the first storage section on a basis of a first control signal; and
supplying a second control signal to a non-volatile third storage section on a basis of a result of the comparison between the data stored in the first storage section and the data stored in the second storage section to thereby cause the third storage section to store data according to the data stored in the second storage section.

13. The method of controlling the semiconductor circuit according to claim 12, further comprising:
supplying, during a first period, a third control signal to the third storage section to thereby cause the first storage section to store the data stored in the third storage section, and causing the second storage section to store the data stored in the first storage section using the first control signal; and
causing, during a second period after the first period, the third storage section to store the data according to the data stored in the second storage section using the second control signal, in a case where the result of the comparison indicates that the data stored in the first storage section and the data stored in the second storage section differ from each other.

14. The method of controlling the semiconductor circuit according to claim 13, further comprising:
causing, during a third period after the second period, the first storage section to store the data stored in the third storage section using the third control signal; and
causing, during a fourth period after the third period, the third storage section to store the data according to the data stored in the second storage section using the second control signal, in a case where the result of the comparison indicates that the data stored in the first storage section and the data stored in the second storage section coincide with each other.

* * * * *